US008034539B2

(12) United States Patent
Magome et al.

(10) Patent No.: US 8,034,539 B2
(45) Date of Patent: Oct. 11, 2011

(54) EXPOSURE APPARATUS AND METHOD FOR PRODUCING DEVICE

(75) Inventors: Nobutaka Magome, Kumagaya (JP); Hiroaki Takaiwa, Kumagaya (JP); Dai Arai, Kita-ku (JP)

(73) Assignee: Nikon Corporation, Tokyo (JP)

( * ) Notice: Subject to any disclaimer, the term of this patent is extended or adjusted under 35 U.S.C. 154(b) by 441 days.

(21) Appl. No.: 11/709,856

(22) Filed: Feb. 23, 2007

(65) Prior Publication Data

US 2007/0171391 A1 Jul. 26, 2007

Related U.S. Application Data

(60) Division of application No. 11/147,356, filed on Jun. 8, 2005, which is a continuation of application No. PCT/JP03/015587, filed on Dec. 5, 2003.

(30) Foreign Application Priority Data

Dec. 10, 2002 (JP) ................................. 2002-357957
Aug. 28, 2003 (JP) ................................. 2003-305279

(51) Int. Cl.
*G03C 5/00* (2006.01)
(52) U.S. Cl. ........ 430/302; 430/311; 430/330; 430/945; 355/27; 355/30; 355/53; 355/72; 355/77
(58) Field of Classification Search .................. 430/302, 430/311, 945, 330; 355/27, 30, 53, 72, 77
See application file for complete search history.

(56) References Cited

U.S. PATENT DOCUMENTS

| | | | |
|---|---|---|---|
| 4,346,164 A | 8/1982 | Tabarelli et al. |
| 4,480,910 A | 11/1984 | Takanashi et al. |
| 4,811,443 A | 3/1989 | Nishizawa |
| 5,209,180 A | 5/1993 | Shoda et al. |
| 5,528,118 A | 6/1996 | Lee |
| 5,610,683 A | 3/1997 | Takahashi |
| 5,623,853 A | 4/1997 | Novak et al. |
| 5,715,039 A | 2/1998 | Fukuda et al. |
| 5,825,043 A | 10/1998 | Suwa |
| 5,853,961 A | 12/1998 | Sakai et al. |
| 5,874,820 A | 2/1999 | Lee |
| 5,896,875 A | 4/1999 | Yoneda |
| 5,969,441 A | 10/1999 | Loopstra et al. |
| 6,341,007 B1 | 1/2002 | Nishi et al. |
| 6,400,441 B1 | 6/2002 | Nishi et al. |
| 6,423,642 B1 | 7/2002 | Peace et al. |
| 6,485,203 B2 | 11/2002 | Katano et al. |
| 6,488,040 B1 | 12/2002 | de Larios et al. |
| 6,536,964 B1 | 3/2003 | Kitano et al. |
| 6,549,269 B1 | 4/2003 | Nishi et al. |
| 6,566,169 B1 | 5/2003 | Uziel et al. |
| 6,585,430 B2 | 7/2003 | Matsuyama et al. |
| 6,590,634 B1 | 7/2003 | Nishi et al. |
| 6,829,035 B2 | 12/2004 | Yogev |
| 7,070,915 B2 | 7/2006 | Ho et al. |
| 7,616,383 B2 | 11/2009 | Streefkerk et al. |
| 2001/0014224 A1 | 8/2001 | Hasebe et al. |
| 2001/0018167 A1 | 8/2001 | Mutoh |
| 2002/0163629 A1 | 11/2002 | Switkes et al. |
| 2003/0030916 A1 | 2/2003 | Suenaga |
| 2003/0174408 A1 | 9/2003 | Rostalski et al. |
| 2004/0000627 A1 | 1/2004 | Schuster |
| 2004/0069329 A1 | 4/2004 | de Larios et al. |
| 2004/0075895 A1 | 4/2004 | Lin |
| 2004/0109237 A1 | 6/2004 | Epple et al. |
| 2004/0114117 A1 | 6/2004 | Bleeker |
| 2004/0118184 A1 | 6/2004 | Violette |
| 2004/0125351 A1 | 7/2004 | Krautschik |
| 2004/0136494 A1 | 7/2004 | Lof et al. |
| 2004/0160582 A1 | 8/2004 | Lof et al. |
| 2004/0165159 A1 | 8/2004 | Lof et al. |
| 2004/0169834 A1 | 9/2004 | Richter et al. |
| 2004/0169924 A1 | 9/2004 | Flagello et al. |
| 2004/0180294 A1 | 9/2004 | Baba-Ali et al. |
| 2004/0180299 A1 | 9/2004 | Rolland et al. |
| 2004/0207824 A1 | 10/2004 | Lof et al. |
| 2004/0211920 A1 | 10/2004 | Derksen et al. |
| 2004/0224265 A1 | 11/2004 | Endo et al. |
| 2004/0224525 A1 | 11/2004 | Endo et al. |
| 2004/0227923 A1 | 11/2004 | Flagello et al. |
| 2004/0253547 A1 | 12/2004 | Endo et al. |
| 2004/0253548 A1 | 12/2004 | Endo et al. |
| 2004/0257544 A1 | 12/2004 | Vogel et al. |
| 2004/0259008 A1 | 12/2004 | Endo et al. |
| 2004/0259040 A1 | 12/2004 | Endo et al. |
| 2004/0263808 A1 | 12/2004 | Sewell |
| 2005/0030506 A1 | 2/2005 | Schuster |
| 2005/0036121 A1 | 2/2005 | Hoogendam et al. |
| 2005/0036183 A1 | 2/2005 | Yeo et al. |
| 2005/0036184 A1 | 2/2005 | Yeo et al. |
| 2005/0036213 A1 | 2/2005 | Mann et al. |

(Continued)

FOREIGN PATENT DOCUMENTS

DE 221 563 A1 4/1985

(Continued)

OTHER PUBLICATIONS

Jul. 14, 2008 Office Action in U.S. Appl. No. 11/147,356.

(Continued)

*Primary Examiner* — Christopher Young
(74) *Attorney, Agent, or Firm* — Oliff & Berridge, PLC

(57) ABSTRACT

An exposure system includes an exposure section for irradiating a formed resist film with exposing light through a mask with an immersion liquid provided on the resist film, and a drying section for drying a surface of the resist film after irradiation.

8 Claims, 14 Drawing Sheets

U.S. PATENT DOCUMENTS

| | | | |
|---|---|---|---|
| 2005/0037269 A1 | 2/2005 | Levinson |
| 2005/0046934 A1 | 3/2005 | Ho et al. |
| 2005/0048223 A1 | 3/2005 | Pawloski et al. |
| 2005/0068639 A1 | 3/2005 | Pierrat et al. |
| 2005/0073670 A1 | 4/2005 | Carroll |
| 2005/0084794 A1 | 4/2005 | Meagley et al. |
| 2005/0094116 A1 | 5/2005 | Flagello et al. |
| 2005/0100745 A1 | 5/2005 | Lin et al. |
| 2005/0110973 A1 | 5/2005 | Streefkerk et al. |
| 2005/0117224 A1 | 6/2005 | Shafer et al. |
| 2005/0122497 A1 | 6/2005 | Lyons et al. |
| 2005/0141098 A1 | 6/2005 | Schuster |
| 2005/0190455 A1 | 9/2005 | Rostalski et al. |
| 2005/0217135 A1 | 10/2005 | O'Donnell et al. |
| 2005/0217137 A1 | 10/2005 | Smith et al. |
| 2005/0217703 A1 | 10/2005 | O'Donnell |
| 2005/0243291 A1 | 11/2005 | Kim |
| 2005/0259232 A1 | 11/2005 | Streefkerk et al. |
| 2006/0051709 A1 | 3/2006 | Endo et al. |
| 2006/0077367 A1 | 4/2006 | Kobayashi et al. |
| 2006/0256316 A1 | 11/2006 | Tanno et al. |

FOREIGN PATENT DOCUMENTS

| | | |
|---|---|---|
| DE | 224 448 A1 | 7/1985 |
| EP | 0 605 103 A1 | 7/1994 |
| EP | 0 805 000 A1 | 11/1997 |
| EP | 1 420 298 A2 | 5/2004 |
| EP | 1 420 299 A2 | 5/2004 |
| JP | A-55-86116 | 6/1980 |
| JP | A-57-153433 | 9/1982 |
| JP | A-58-202448 | 11/1983 |
| JP | A-59-19912 | 2/1984 |
| JP | A 62-065326 | 3/1987 |
| JP | A-63-157419 | 6/1988 |
| JP | A-1-120023 | 5/1989 |
| JP | A-1-214042 | 8/1989 |
| JP | A-3-215867 | 9/1991 |
| JP | A-4-305915 | 10/1992 |
| JP | A-4-305917 | 10/1992 |
| JP | A-5-62877 | 3/1993 |
| JP | A 05-304072 | 11/1993 |
| JP | A 06-124873 | 5/1994 |
| JP | A 06-168866 | 6/1994 |
| JP | A 07-220990 | 8/1995 |
| JP | A-8-166475 | 6/1996 |
| JP | A-8-316125 | 11/1996 |
| JP | A-8-330224 | 12/1996 |
| JP | A-9-199470 | 7/1997 |
| JP | A 10-163099 | 6/1998 |
| JP | A 10-214783 | 8/1998 |
| JP | A-10-214783 | 8/1998 |
| JP | A 10-255319 | 9/1998 |
| JP | A 10-303114 | 11/1998 |
| JP | A-10-303114 | 11/1998 |
| JP | A 10-340846 | 12/1998 |
| JP | A-11-176727 | 7/1999 |
| JP | A-2000-58436 | 2/2000 |
| JP | A 2000-505958 | 5/2000 |
| WO | WO 99/49504 | 9/1999 |
| WO | WO99/49504 | 9/1999 |
| WO | WO 02/29137 A3 | 4/2002 |
| WO | WO 02/091078 A1 | 11/2002 |
| WO | WO 03/077037 A1 | 9/2003 |
| WO | WO 2004/019128 A2 | 3/2004 |
| WO | WO 2004/055803 A1 | 7/2004 |
| WO | WO 2004/057589 A1 | 7/2004 |
| WO | WO 2004/057590 A1 | 7/2004 |
| WO | WO 2004/077154 A2 | 9/2004 |
| WO | WO 2004/081666 A1 | 9/2004 |
| WO | WO 2004/090577 A2 | 10/2004 |
| WO | WO 2004/090633 A2 | 10/2004 |
| WO | WO 2004/090634 A2 | 10/2004 |
| WO | WO 2004/092830 A2 | 10/2004 |
| WO | WO 2004/092833 A2 | 10/2004 |
| WO | WO 2004/093130 A2 | 10/2004 |
| WO | WO 2004/093159 A2 | 10/2004 |
| WO | WO 2004/093160 A2 | 10/2004 |
| WO | WO 2004/095135 A2 | 11/2004 |
| WO | WO 2005/001432 A2 | 1/2005 |
| WO | WO 2005/003864 A2 | 1/2005 |
| WO | WO 2005/006026 A2 | 1/2005 |
| WO | WO 2005/008339 A2 | 1/2005 |
| WO | WO 2005/013008 A2 | 2/2005 |
| WO | WO 2005/015283 A1 | 2/2005 |
| WO | WO 2005/017625 A2 | 2/2005 |
| WO | WO 2005/019935 A2 | 3/2005 |
| WO | WO 2005/022266 A2 | 3/2005 |
| WO | WO 2005/024325 A2 | 3/2005 |
| WO | WO 2005/024517 A2 | 3/2005 |
| WO | WO 2005/034174 A2 | 4/2005 |
| WO | WO 2005/054953 A2 | 6/2005 |
| WO | WO 2005/054955 A2 | 6/2005 |
| WO | WO 2005/062128 A2 | 7/2005 |

OTHER PUBLICATIONS

May 5, 2009 Office Action in U.S. Appl. No. 11/147,356.
Sep. 11, 2009 Office Action in U.S. Appl. No. 11/365,869.
Oct. 23, 2009 Australian Written Opinion in Singapore Patent Application No. 200704277-3.
Dec. 31, 2009 Notice of Allowance in U.S. Appl. No. 11/147,356.
Emerging Lithographic Technologies VI, Proceedings of SPIE, vol. 4688 (2002), "Semiconductor Foundry, Lithography, and Partners", B.J. Lin, pp. 11-24.
Optical Microlithography XV, Proceedings of SPIE, vol. 4691 (2002), "Resolution Enhancement of 157 nm Lithography by Liquid Immersion", M. Switkes et al., pp. 459-465.
J. Microlith., Microfab., Microsyst., vol. 1 No. 3, Oct. 2002, Society of Photo-Optical Instrumentation Engineers, "Resolution enhancement of 157 nm lithography by liquid immersion", M. Switkes et al., pp. 1-4.
Nikon Corporation, Litho Forum, Jan. 28, 2004, "Update on 193 nm immersion exposure tool", S. Owa et al., 51 pages (slides 1-51).
Nikon Corporation, Immersion Lithography Workshop, Dec. 11, 2002, 24 pages (slides 1-24).
Nikon Corporation, Immersion Workshop, Jan. 27, 2004, "Update on 193 nm immersion exposure tool", S. Owa et al., 38 pages (slides 1-38).
Nikon Corporation, $3^{rd}$ 157 nm symposium, Sep. 4, 2002, "Nikon F2 Exposure Tool", Soichi Owa et al., 25 pages (slides 1-25).
Optical Microlithography XVI, Proceedings of SPIE vol. 5040 (2003), "Immersion lithography; its potential performance and issues", Soichi Owa et al., pp. 724-733.
Nikon Corporation, NGL Workshop, Jul. 10, 2003, :Potential performance and feasibility of immersion lithography, Soichi Owa et al., 33 pages, slides 1-33.
Oct. 6, 2010 Korean Office Action in Korean Application No. 2005-7009359, with translation.
Jan. 26, 2010 Office Action in Japanese Application No. 2003-410472, with translation.
Mar. 21, 2007 Office Action in Chinese Application No. 200380105419.3, with translation.
Jun. 28, 2010 Office Action in U.S. Appl. No. 11/365,869.
Apr. 5, 2010 Notice of Allowance in U.S. Appl. No. 11/147,356.
Aug. 6, 2010 Notice of Allowance in U.S. Appl. No. 11/147,356.
Sep. 30, 2010 Invitation to Respond to Written Opinion in Singapore Application No. 200704277-3.
Mar. 30, 2011 Office Action in Taiwan Patent Application No. 092134794, with translation.
May 11, 2011 Search and Examination Report in Singapore Application No. 200704277-3.
May 12, 2011 Office Action in U.S. Appl. No. 11/147,356.
Apr. 6, 2004 International Search Report issued in PCT/JP03/15587 (with translation).
Sep. 15, 2008 Supplementary European Search Report issued in European patent Application No. 03777282.9.
Mar. 9, 2006 Written Opinion issued in Singapore Patent Application No. 200503450-9.
Oct. 17, 2006 Examination Report issued in Singapore Patent Application No. 200503450-9.
Mar. 23, 2009 Search Report and Written Opinion issued in Singapore Patent Application No. 200704277-3.

Aug. 28, 2009 Office Action issued in Chinese Patent Application No. 200810082275.9 (with translation).

Aug. 28, 2009 Office Action issued in Chinese Patent Application No. 200810082276.3 (with translation).

Aug. 28, 2009 Office Action issued in Chinese Patent Application No. 200810082277.8 (with translation).

Jan. 11, 2011 Office Action issued in Korean Application No. 10-2010-7027419 (with translation).

EXPOSURE APPARATUS AND METHOD FOR PRODUCING DEVICE

CROSS-REFERENCE

This is a Division of application Ser. No. 11/147,356 filed Jun. 8, 2005, which in turn is a Continuation of International Application No. PCT/JP03/015587 filed Dec. 5, 2003 claiming the conventional priority of Japanese patent Application Nos. 2002-357957 filed on Dec. 10, 2002 and 2003-305279 filed on Aug. 28, 2003. The disclosures of these prior applications are incorporated herein by reference in their entireties.

BACKGROUND OF THE INVENTION

1. Field of the Invention

The present invention relates to an exposure apparatus for exposing a substrate with a pattern image projected by a projection optical system while filling, with a liquid, at least a part of a space between the projection optical system and the substrate. The present invention also relates to a liquid-removing apparatus to be used for the exposure apparatus, and a method for producing a device based on the use of the exposure apparatus.

2. Description of the Related Art

Semiconductor devices and liquid crystal display devices are produced by the so-called photolithography technique in which a pattern formed on a mask is transferred onto a photosensitive substrate. The exposure apparatus, which is used in the photolithography step, includes a mask stage for supporting the mask and a substrate stage for supporting the substrate. The pattern on the mask is transferred onto the substrate via a projection optical system while successively moving the mask stage and the substrate stage. In recent years, it is demanded to realize the higher resolution of the projection optical system in order to respond to the further advance of the higher integration of the device pattern. As the exposure wavelength to be used becomes shorter, the resolution of the projection optical system is higher. As the numerical aperture of the projection optical system becomes larger, the resolution of the projection optical system is higher. Therefore, the exposure wavelength, which is used for the exposure apparatus, is shortened year by year, and the numerical aperture of the projection optical system is increased as well. The exposure wavelength, which is dominantly used at present, is 248 nm of the KrF excimer laser. However, the exposure wavelength of 193 nm of the ArF excimer laser, which is shorter than the above, is also practically used in some situations. When the exposure is performed, the depth of focus (DOF) is also important in the same manner as the resolution. The resolution R and the depth of focus δ are represented by the following expressions respectively.

$$R = k_1 \cdot \lambda / NA \quad (1)$$

$$\delta = \pm k_2 \cdot \lambda / NA^2 \quad (2)$$

In the expressions, λ represents the exposure wavelength, NA represents the numerical aperture of the projection optical system, and k1 and k2 represent the process coefficients. According to the expressions (1) and (2), the following fact is appreciated. That is, when the exposure wavelength λ is shortened and the numerical aperture NA is increased in order to enhance the resolution R, then the depth of focus δ is narrowed.

If the depth of focus δ is too narrowed, it is difficult to match the substrate surface with respect to the image plane of the projection optical system. It is feared that the margin is insufficient during the exposure operation. Accordingly, the liquid immersion method has been suggested, which is disclosed, for example, in International Publication No. 99/49504 as a method for substantially shortening the exposure wavelength and widening the depth of focus. In this liquid immersion method, the space between the lower surface of the projection optical system and the substrate surface is filled with a liquid such as water or any organic solvent to utilize the fact that the wavelength of the exposure light beam in the liquid is 1/n as compared with that in the air (n represents the refractive index of the liquid, which is about 1.2 to 1.6 in ordinary cases) so that the resolution is improved and the depth of focus is magnified about n times.

When the substrate is subjected to the exposure process by using the liquid immersion method, the liquid remains in some cases on the surface of the substrate after the exposure process. If the substrate is transported in a state in which the remaining liquid adheres to the substrate, then the liquid falls from the substrate during the transport, and inconveniences arise, for example, such that respective apparatuses and members, which are disposed around the transport passage, become rusty due to the fallen liquid, and/or the cleanness cannot be maintained in the environment in which the exposure apparatus is arranged. In other cases, the environmental change (humidity change) is caused by the fallen liquid around the exposure apparatus. If the humidity change is caused, the following problems arise. That is, for example, any fluctuation arises in the air on the optical path of the optical interferometer which is to be used to measure the position of the stage. The position of the stage is not measured accurately, and it is impossible to obtain any desired pattern transfer accuracy. Further, for example, if the development process is executed in a state in which the liquid adheres to the substrate after the exposure process, it is feared that any device having desired performance cannot be produced.

SUMMARY OF THE INVENTION

The present invention has been made taking the foregoing circumstances into consideration, an object of which is to provide an apparatus which is capable of suppressing the device deterioration caused by the liquid adhered to a substrate after the exposure when the exposure process is performed while filling the space between the projection optical system and the substrate with the liquid, an exposure apparatus in which the apparatus is incorporated, and a method for producing a device based on the use of the exposure apparatus.

In order to solve the problems as described above, the present invention adopts the following features.

According to a first aspect of the present invention, there is provided an exposure apparatus for transferring an image of a pattern via a liquid onto a substrate to expose the substrate therewith, the exposure apparatus comprising:

a projection optical system which projects the image of the pattern onto the substrate;

a connecting section which is connected to a processing apparatus for processing the exposed substrate; and a liquid-removing unit which removes the liquid adhered to the substrate before the substrate is transported to the processing apparatus through the connecting section.

According to the present invention, the liquid-removing unit is provided, which removes the liquid adhered to the substrate before the substrate is transported to the processing apparatus which performs a predetermined process for the substrate to which the exposure process has been applied.

Accordingly, the predetermined process can be performed for the substrate in a state in which the liquid is removed. Therefore, it is possible to produce a device having desired performance.

According to a second aspect of the present invention, there is provided an exposure apparatus for transferring an image of a pattern via a liquid onto a substrate to expose the substrate therewith, the exposure apparatus comprising:

a projection optical system which projects the image of the pattern onto the substrate;

a liquid-removing unit which removes the liquid adhered to the substrate;

a first transport member which transports the exposed substrate to the liquid-removing unit; and a second transport member which transports, from the liquid-removing unit, the substrate from which the liquid has been removed by the liquid-removing unit.

According to the present invention, the liquid-removing unit is provided, which removes the liquid for the exposure adhered to the substrate after the exposure for the substrate. Therefore, it is possible to suppress the occurrence of inconveniences which would be otherwise caused, for example, such that the liquid falls from the substrate during the transport of the liquid, resulting in the environmental change. In this arrangement, the substrate, which has been subjected to the exposure process by the liquid immersion method and to which the liquid is adhered, can be transported to the liquid-removing unit by the first transport member. Further, the substrate, from which the liquid has been removed by the liquid-removing unit, is transported by the second transport member which is provided separately from the first transport member. Accordingly, it is possible to transport the substrate to a predetermined position in a state in which no liquid is adhered to the substrate. In the present invention, it is preferable that at least a part of a surface of the first transport member is liquid-repellent.

According to a third aspect of the present invention, there is provided an exposure apparatus for transferring an image of a pattern via a liquid onto a substrate to expose the substrate therewith, the exposure apparatus comprising:

a projection optical system which projects the image of the pattern onto the substrate;

a transport system which transports the exposed substrate; and a liquid-removing unit which is provided on a transport passage for the substrate and which removes the liquid adhered to the substrate, wherein:

the liquid-removing unit has a cover which covers at least a part of surroundings of the substrate so that the liquid is prevented from being scattered when the liquid is removed.

According to the present invention, the liquid-removing unit, which removes the liquid for the exposure adhered to the substrate, is provided at an intermediate position of the transport passage of the transport system for transporting the substrate. Accordingly, it is possible to simultaneously perform the exposure process executed by the exposure apparatus (main body of exposure apparatus) and the liquid-removing process executed by the liquid-removing unit provided at the intermediate position of the transport passage. Therefore, it is possible to execute the respective processes without degrading the throughput. In this arrangement, the liquid-removing unit is provided with the cover which avoids the scattering of the liquid. Accordingly, it is possible to avoid the scattering of the liquid to the surroundings of the transport passage. Therefore, it is possible to avoid the environmental change such as the humidity change and the occurrence of rust or the like on the apparatus. In the present invention, it is preferable that the cover includes a chamber.

In the exposure apparatuses according to the first to third aspects described above, it is preferable that the liquid-removing unit includes a washing unit which washes the substrate after the exposure, and a washing liquid adhered to the substrate is removed after the substrate is washed by the washing unit.

According to a fourth aspect of the present invention, there is provided an exposure apparatus for transferring an image of a pattern via a liquid onto a substrate to expose the substrate therewith, the exposure apparatus comprising:

a projection optical system which projects the image of the pattern onto the substrate;

a substrate stage which holds the substrate; and a liquid-removing unit which removes the liquid adhered to the substrate before the exposed substrate is exported from the substrate stage.

According to the present invention, the liquid, which is adhered to the substrate, is removed before the substrate is exported from the substrate stage on which the exposure process is performed. Accordingly, it is possible to suppress the occurrence of inconveniences which would be otherwise caused such that the liquid falls from the substrate during the transport of the substrate.

In the exposure apparatuses according to the first to fourth aspects described above, it is also preferable that the substrate, to which the liquid is adhered, is transported while being inclined by a predetermined angle with respect to a horizontal plane after the exposure. Further, the liquid-removing unit may remove the liquid from the substrate by blowing off, suction, and/or drying.

According to a fifth aspect of the present invention, there is provided an exposure apparatus for transferring an image of a pattern via a liquid onto a substrate to expose the substrate therewith, the exposure apparatus comprising:

a projection optical system which projects the image of the pattern onto the substrate;

a transport system which transports the exposed substrate; and a liquid-processing mechanism which processes the liquid fallen from the substrate after the exposure and which is arranged under at least a part of a transport passage for the substrate.

According to the present invention, when the substrate after the exposure is transported by using the transport system, even if the liquid is adhered to the substrate, then the liquid, which has fallen from the substrate during the transport, is processed by using the liquid-processing mechanism, and thus it is possible to avoid the scattering of the liquid to the surroundings of the transport passage. Therefore, it is possible to avoid the environmental change such as the humidity change and the occurrence of rust or the like on the apparatus. The liquid-processing mechanism may include a gutter member which is arranged under at least a part of the transport passage, and a discharge mechanism which discharges the liquid recovered by the gutter member.

According to a sixth aspect of the present invention, there is provided an exposure apparatus for transferring an image of a pattern via a liquid onto a substrate to expose the substrate therewith, the exposure apparatus comprising:

a projection optical system which projects the image of the pattern onto the substrate; and a washing unit which washes the exposed substrate before the substrate is exported to a processing apparatus which processes the exposed substrate.

According to the present invention, foreign matters or the like, which adhere to the surface of the substrate during the liquid immersion exposure or during the transport of the substrate after the exposure, can be washed out. It is possible to feed the clean substrate. In particular, when the liquid, which is used for the liquid immersion exposure, is a liquid other than water, for example, any organic liquid such as cedarwood oil or fluorine-based oil, it is desirable to remove such a liquid by using the washing unit so as not to affect the process for the substrate to be performed thereafter.

According to a seventh aspect of the present invention, there is provided an exposure apparatus for transferring an image of a pattern via a liquid onto a substrate to expose the substrate therewith, the exposure apparatus comprising:

a projection optical system which projects the image of the pattern onto the substrate;

a first transport member which transports the substrate to which the liquid is adhered; and a second transport member which transports the substrate to which the liquid is not adhered.

According to the present invention, the first transport member for transporting the substrate to which the liquid is adhered and the second transport member for transporting the substrate to which the liquid is not adhered are separately used. Therefore, it is possible to avoid the adhesion of the liquid to the second transport member and/or the adhesion of the liquid to the substrate transported by the second transport member. Thus, it is possible to suppress the diffusion and the scattering of the liquid.

According to an eighth aspect of the present invention, there is provided an exposure apparatus for exposing a substrate by radiating an exposure light beam onto the substrate via a liquid, the exposure apparatus comprising:

a first holding member which is movable while holding the substrate;

a second holding member which is movable while holding another substrate; and a liquid-removing unit which removes the liquid adhered to the substrate for which the exposure is completed and which is held by the second holding member when the substrate, which is held by the first holding member, is subjected to the exposure.

According to the present invention, at least parts of the exposure process for the substrate held by one holding member and the liquid-removing process for the substrate after the exposure held by the other holding member are performed concurrently. Accordingly, it is possible to suppress the decrease in the throughput which would be otherwise accompanied by the liquid-removing process.

According to a ninth aspect of the present invention, there is provided a liquid-removing apparatus to be used together with an exposure apparatus for transferring an image of a pattern via a liquid onto a substrate to expose the substrate therewith, the liquid-removing apparatus comprising:

a holding section which holds the exposed substrate; and a liquid-removing mechanism which removes the liquid for the exposure existing on the substrate.

According to a tenth aspect of the present invention, there is provided an exposure system comprising the exposure apparatus of the present invention; and a processing apparatus which processes an exposed substrate. The processing apparatus may include at least one of a coating unit which coats a base member of the substrate with a photosensitive material, and a developing unit which develops the exposed substrate.

The present invention provides a method for producing a device, comprising using the exposure apparatus according to each of the aspects described above. According to the present invention, it is possible to suppress the change of the environment of the exposure process resulting from the liquid adhered to the substrate and the influence exerted on a predetermined process (for example, the developing process) for the substrate after the exposure process. Therefore, it is possible to produce a device having desired performance.

DESCRIPTION OF THE PREFERRED EMBODIMENTS OF THE INVENTION

First Embodiment

Figure 1:
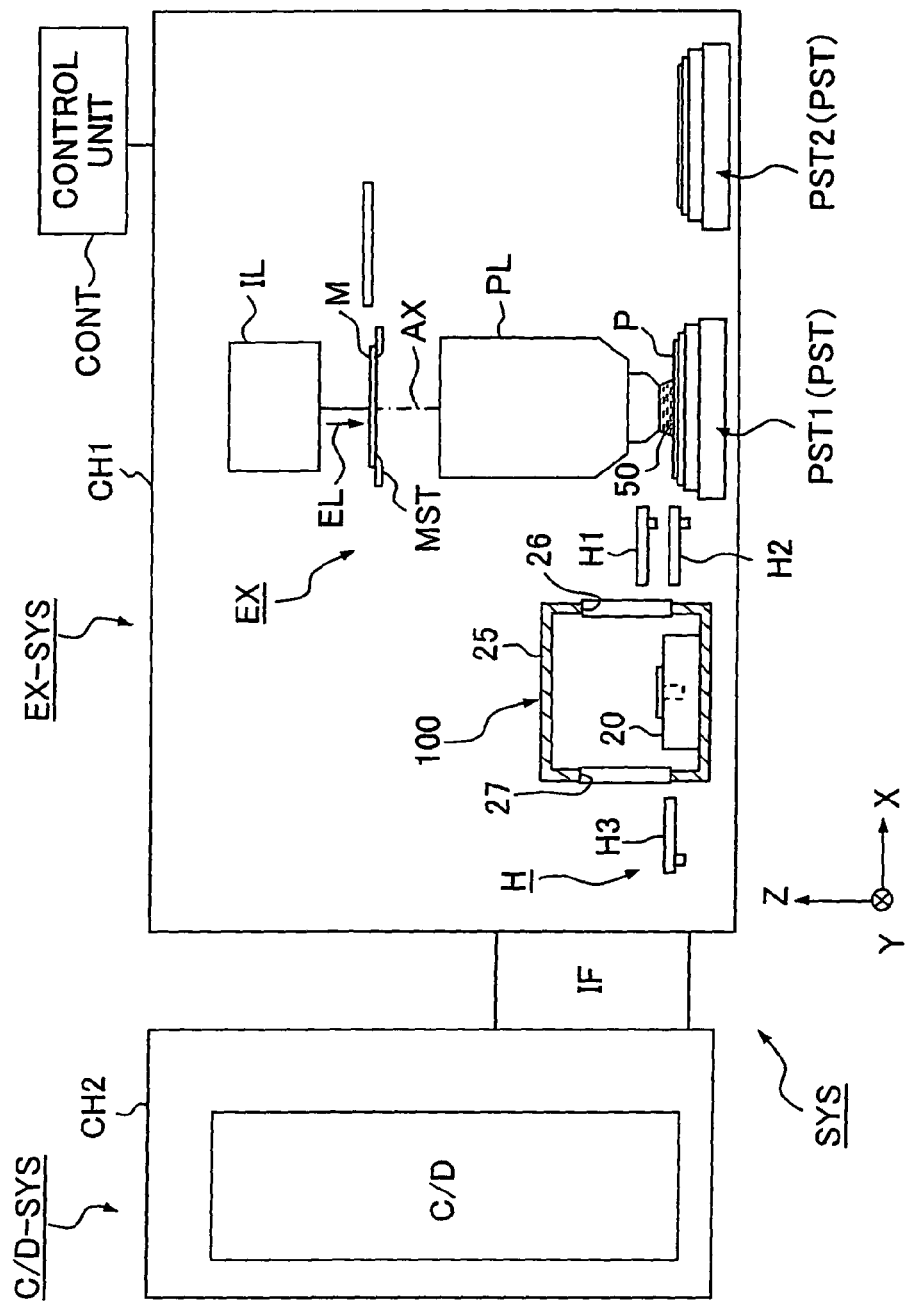
FIG. 1 shows a schematic arrangement illustrating an embodiment of a device-producing system as an exposure apparatus of the present invention.
Figure 2:
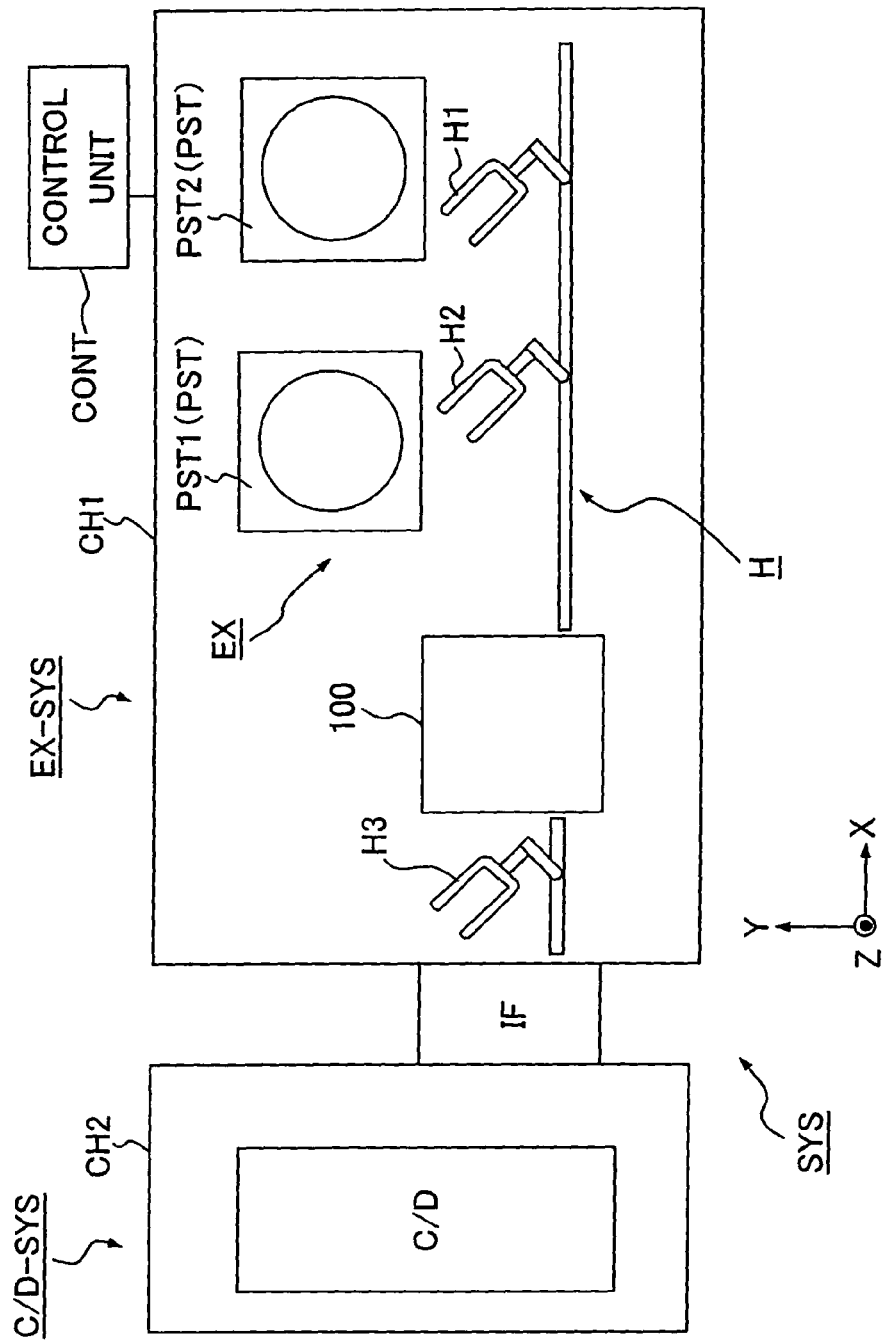
FIG. 2 shows a view illustrating those shown in FIG. 1 as viewed from an upper position.

The exposure apparatus and the method for producing the device according to the present invention will be explained below with reference to the drawings. FIG. 1 shows a schematic arrangement as viewed from a side position, illustrating an embodiment of a device-producing system provided with an exposure apparatus of the present invention. FIG. 2 shows a view illustrating those shown in FIG. 1 as viewed from an upper position.

With reference to FIGS. 1 and 2, the device-producing system SYS includes an exposure apparatus EX-SYS and a coater-developer apparatus C/D-SYS. The exposure apparatus EX-SYS includes an interface section IF which forms a connecting section with respect to the coater-developer apparatus C/D-SYS, a main body of the exposure apparatus EX which projects an image of a pattern onto a substrate P via a projection optical system PL and a liquid 50 to expose the substrate P while filling the space between the projection optical system PL and the substrate P with the liquid 50, a transport system H which transports the substrate P between the interface section IF and the main body of exposure apparatus EX, a liquid-removing unit 100 which is provided at an intermediate position of a transport passage of the transport system H and which removes the liquid adhered to the substrate P after the exposure process, and a control unit CONT which collectively controls the entire operation of the exposure apparatus EX-SYS. The coater-developer system C/D-SYS includes a coating unit C which coats a base member of the substrate P to be subjected to the exposure process with a photoresist (photosensitive agent), and a developing unit (processing unit) D which performs the developing process for the substrate P after being subjected to the exposure process performed by the main body of exposure apparatus EX. The main body of exposure apparatus EX is arranged in a first chamber unit CH1 in which the cleanness is managed. On the other hand, the coating unit C and the developing unit D are arranged in a second chamber unit CH2 which is provided separately from the first chamber unit CH1. The first chamber unit CH1 for accommodating the main body of exposure apparatus EX and the second chamber unit CH2 for accommodating the coating unit C and the developing unit D are connected by the interface section IF. In the following description, the coating unit C and the developing unit D, which are accommodated in the second chamber unit CH2, are appropriately referred to as "main coater-developer body C/D" in combination.

As shown in FIG. 1, the main body of exposure apparatus EX includes an illumination optical system IL which illuminates a mask M supported by a mask stage MST with an exposure light beam EL, a projection optical system PL which projects an image of a pattern of the mask M illuminated with the exposure light beam EL onto the substrate P, and a substrate stage PST which supports the substrate P. The main body of exposure apparatus in this embodiment adopts the so-called twin-stage system which includes the two substrate stages PST1, PST2. Specified constructions of the twin-stage system are disclosed in literatures including, for example, Japanese Patent Application Laid-open Nos. 10-163099 and 10-214783, Published Japanese Translation of PCT International Publication for Patent Application No. 2000-505958, and U.S. Pat. Nos. 6,341,007, 6,400,441, 6,549,269, and 6,590,634, and reference may be made thereto. U.S. Pat. Nos. described above are incorporated herein by reference within a range of permission of the domestic laws and ordinances of the state designated or selected in this international application. In the present invention, it is possible to adopt the twin-stage system disclosed in any one of the literatures described above. The main body of exposure apparatus EX in this embodiment is a scanning type exposure apparatus (so-called scanning stepper) in which the substrate P is exposed with the pattern formed on the mask M while synchronously moving the mask M and the substrate P in mutually different directions (opposite directions) in the scanning directions. In the following explanation, the X axis direction resides in the synchronous movement direction (scanning direction) for the mask M and the substrate P in the horizontal plane, the Y axis direction resides in the direction (non-scanning direction) perpendicular to the X axis direction in the horizontal plane, and the Z axis direction resides in the direction which is perpendicular to the X axis and the Y axis directions and which is coincident with the optical axis AX of the projection optical system PL. The directions about the X axis, the Y axis, and the Z axis are designated as θX, θY, and θZ directions respectively. The term "substrate" referred to herein includes those obtained by coating a semiconductor wafer with a resist, and the term "mask" includes a reticle formed with a device pattern to be subjected to the reduction projection onto the substrate.

The transport system H includes a first transport unit H1 which imports (loads) the substrate P before being subjected to the exposure process to the substrate stage PST, a second transport unit H2 which exports (unloads) the substrate P after being subjected to the exposure process from the substrate stage PST and which transports the substrate P to the liquid-removing unit 100, and a third transport unit H3 which transports the substrate P between the liquid-removing unit 100 and the interface section IF. The first, second, and third transport units H1, H2, and H3 are provided in the first chamber unit CH1. The substrate P, which is subjected to the coating process of the photoresist by the main coater-developer body C/D (coating unit C), is delivered to the third transport unit H3 via the interface section IF. In this embodiment, an opening and a shutter for opening/closing the opening are provided at a portion of each of the first and second chamber units CH1, CH2 to face the interface section IF. The shutter is opened during the operation for transporting the substrate P to the interface section IF. The third transport unit H3 delivers the substrate P before being subjected to the exposure process to the first transport unit H1 via the liquid-removing unit 100. When the substrate P is delivered from the third transport unit H3 to the first transport unit H1, the substrate P may be delivered to the first transport unit H1 via an unillustrated another transport unit and/or a relay unit without passing through the liquid-removing unit 100. The first transport unit H1 loads the delivered substrate P to the substrate stage PST of the main body of exposure apparatus EX. The substrate P after being subjected to the exposure process is unloaded from the substrate stage PST by the aid of the second transport unit H2. The second transport unit H2 delivers the unloaded substrate P to the third transport unit H3 via the liquid-removing unit 100. The substrate P, which has been transported by the third transport unit H3, is carried to the main coater-developer body C/D (developing unit D) via the interface section IF. The developing unit D applies the developing process to the delivered substrate P.

The first transport unit H1, which imports the substrate P that is not wet before being subjected to the exposure process to the substrate stage PST, is used separately from the second transport unit H2 which exports the substrate P that is possibly wet after being subjected to the exposure process from the substrate stage PST. Therefore, the liquid is not adhered to the first transport unit (transport member) H1. It is possible to avoid the adhesion of the liquid, for example, to the back surface of the substrate P to be transported by the first transport unit H1.

Figure 3:
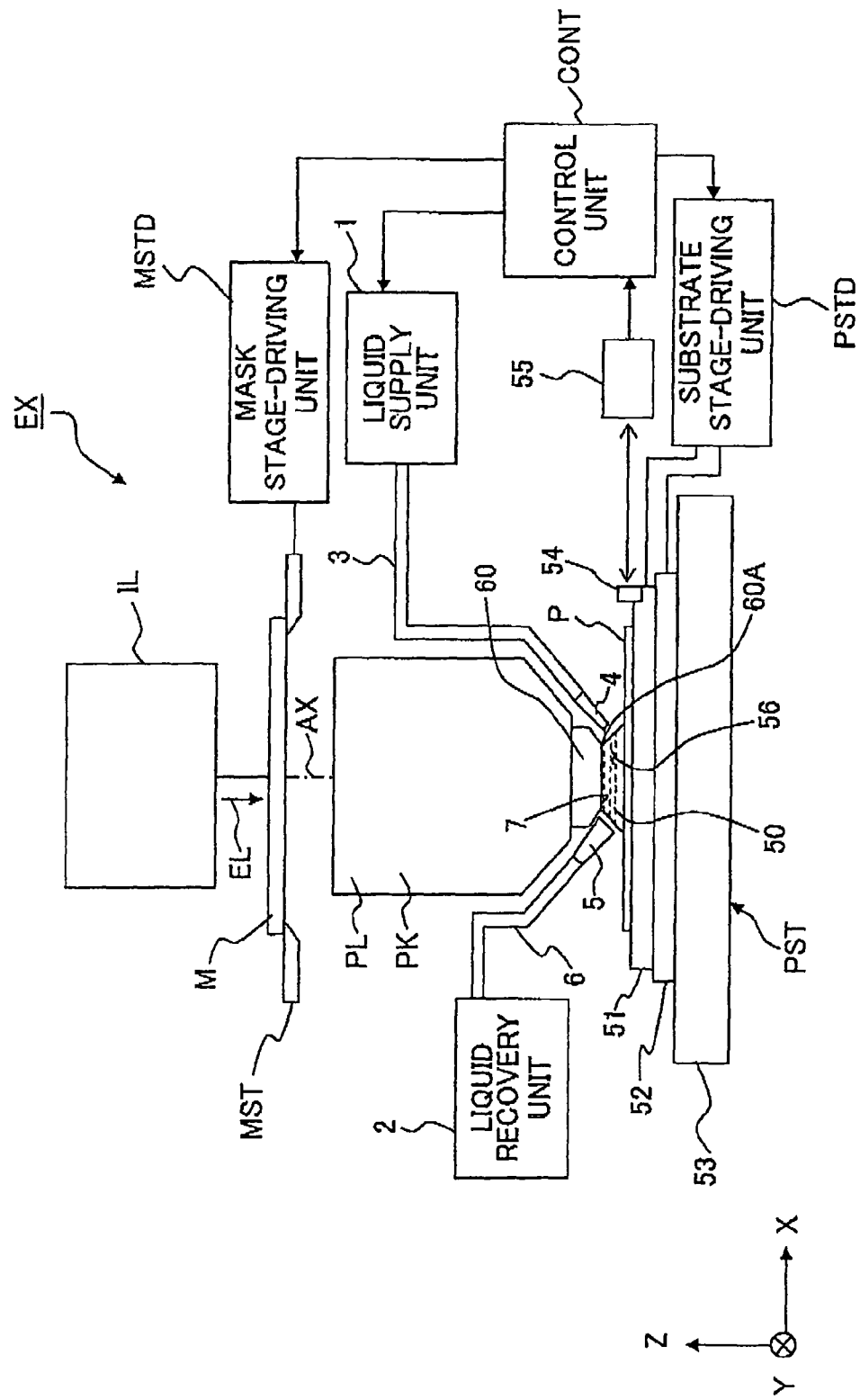
FIG. 3 shows a schematic arrangement illustrating an embodiment of a main body of an exposure apparatus to perform the exposure process.

FIG. 3 shows a schematic arrangement of the main body of the exposure apparatus EX. The illumination optical system IL is used so that the mask M, which is supported on the mask stage MST, is illuminated with the exposure light beam EL. The illumination optical system IL includes, for example, an exposure light source, an optical integrator which uniformizes the illuminance of the light flux radiated from the exposure light source, a condenser lens which collects the exposure light beam EL supplied from the optical integrator, a relay lens system, and a variable field diaphragm which sets the illumination area on the mask M illuminated with the exposure light beam EL to be slit-shaped. The predetermined illumination area on the mask M is illuminated with the exposure light beam EL having a uniform illuminance distribution by the illumination optical system IL. Those usable as the exposure light beam EL radiated from the illumination optical system IL include, for example, bright lines (g-ray, h-ray, i-ray) in the ultraviolet region radiated, for example, from a mercury lamp, far ultraviolet light beams (DUV light beams) such as the KrF excimer laser beam (wavelength: 248 nm), and vacuum ultraviolet light beams (VUV light beams) such as the ArF excimer laser beam (wavelength: 193 nm) and the $F_2$ laser beam (wavelength: 157 nm). In this embodiment, the ArF excimer laser beam is used.

The mask stage MST supports the mask M. The mask stage MST is two-dimensionally movable in the plane perpendicular to the optical axis AX of the projection optical system PL, i.e., in the XY plane, and it is finely rotatable in the θz direction. The mask stage MST is driven by a mask stage-driving unit MSTD such as a linear motor. The mask stage-driving unit MSTD is controlled by the control unit CONT. The position in the two-dimensional direction and the angle of rotation of the mask M on the mask stage MST are measured in real-time by a laser interferometer. The result of the measurement is outputted to the control unit CONT. The control unit CONT drives the mask stage-driving unit MSTD on the basis of the result of the measurement obtained by the laser interferometer to thereby position the mask M supported on the mask stage MST.

The projection optical system PL projects the pattern on the mask M onto the substrate P at a predetermined projection magnification β to perform the exposure. The projection optical system PL includes a plurality of optical elements (lenses). The optical elements are supported by a barrel PK as a metal member. In this embodiment, the projection optical system PL is based on the reduction system having the projection magnification β which is, for example, ¼ or ⅕. The projection optical system PL may be any one of the 1× magnification system and the magnifying system. Alternatively, the projection optical system PL may be composed of mirrors. The optical element (lens) 60 is exposed from the barrel PK on the side of the tip (on the side of the substrate P) of the projection optical system PL of this embodiment. The optical element 60 is provided detachably (exchangeably) with respect to the barrel PK.

The substrate stage PST supports the substrate P. The substrate stage PST includes a Z stage 51 which retains the substrate P by the aid of a substrate holder, an XY stage 52 which supports the Z stage 51, and a base 53 which supports the XY stage 52. The substrate stage PST is driven by a substrate stage-driving unit PSTD such as a linear motor. The substrate stage-driving unit PSTD is controlled by the control unit CONT. When the Z stage 51 is driven, the substrate P, which is retained on the Z stage 51, is subjected to the control of the position (focus position) in the Z axis direction and the positions in the θX and θY directions. When the XY stage 52 is driven, the substrate P is subjected to the control of the position in the XY directions (position in the directions substantially parallel to the image plane of the projection optical system PL). That is, the Z stage 51 controls the focus position and the angle of inclination of the substrate P so that the surface of the substrate P is adjusted to match the image plane of the projection optical system PL in the auto-focus manner and the auto-leveling manner. The XY stage 52 positions the substrate P in the X axis direction and the Y axis direction. It goes without saying that the Z stage and the XY stage may be provided as an integrated body.

A movement mirror 54 is provided on the substrate stage PST (Z stage 51). A laser interferometer 55 is provided at a position opposed to the movement mirror 54. The angle of rotation and the position in the two-dimensional direction of the substrate P on the substrate stage PST are measured in real-time by the laser interferometer 55. The result of the measurement is outputted to the control unit CONT. The control unit CONT drives the substrate stage-driving unit PSTD on the basis of the result of the measurement of the laser interferometer 55 to thereby position the substrate P supported on the substrate stage PST.

In this embodiment, the liquid immersion method is applied in order that the resolution is improved by substantially shortening the exposure wavelength and the depth of focus is substantially widened. Therefore, the space between the surface of the substrate P and the tip surface (lower surface) 7 of the optical element (lens) 60 of the projection optical system PL on the side of the substrate P is filled with the predetermined liquid 50 at least during the period in which the image of the pattern on the mask M is transferred onto the substrate P. As described above, the lens 60 is exposed on the tip side of the projection optical system PL, and the liquid 50 is allowed to make contact with only the lens 60. Accordingly, the barrel PK composed of the metal is prevented from any corrosion or the like. In this embodiment, pure water is used for the liquid 50. The exposure light beam EL, which is not limited to only the ArF excimer laser beam, can be transmitted through pure water, even when the exposure light beam EL is, for example, the bright line (g-ray, h-ray, i-ray) in the ultraviolet region radiated, for example, from a mercury lamp or the far ultraviolet light beam (DUV light beam) such as the KrF excimer laser beam (wavelength: 248 nm).

The main body of the exposure apparatus EX includes a liquid supply unit 1 which supplies the predetermined liquid 50 to the space 56 between the substrate P and the tip surface (end surface of the lens 60) 7 of the projection optical system PL, and a liquid recovery unit 2 which recovers the liquid 50 from the space 56. The liquid supply unit 1 is provided to fill at least a part of the space between the projection optical system PL and the substrate P with the liquid 50. The liquid supply unit 1 includes, for example, a tank for accommodating the liquid 50, and a pressurizing pump. One end of a supply tube 3 is connected to the liquid supply unit 1. Supply nozzles 4 are connected to the other end of the supply tube 3. The liquid supply unit 1 supplies the liquid 50 to the space 56 via the supply tube 3 and the supply nozzles 4.

The liquid recovery unit 2 includes, for example, a suction pump, and a tank for accommodating the recovered liquid 50. One end of a recovery tube 6 is connected to the liquid recovery unit 2. Recovery nozzles 5 are connected to the other end of the recovery tube 6. The liquid recovery unit 2 recovers the liquid 50 from the space 56 via the recovery nozzles 5 and the recovery tube 6. When the space 56 is filled with the liquid 50, then the control unit CONT drives the liquid supply unit 1 so that the liquid 50, which is in a predetermined amount per unit time, is supplied to the space 56 via the supply tube 3 and the supply nozzles 4, and the control unit CONT drives the liquid recovery unit 2 so that the liquid 50, which is in a predetermined amount per unit time, is recovered from the space 56 via the recovery nozzles 5 and the recovery tube 6. Accordingly, the liquid 50 is arranged in the space 56 between the substrate P and the tip surface 7 of the projection optical system PL.

The lens 60, which is disposed at the lowest end of the projection optical system PL, is formed to have a rectangular shape which is long in the Y axis direction (non-scanning direction) while remaining only the portion required for the end portion 60A in the scanning direction. During the scanning exposure, a pattern image of a part of the mask M is projected onto the rectangular projection area disposed just under the end portion 60A. The mask M is moved at the velocity V in the −X direction (or in the +X direction) with respect to the projection optical system PL, in synchronization with which the substrate P is moved at the velocity β·V (β is the projection magnification) in the +X direction (or in the −X direction) by the aid of the XY stage 52. After the completion of the exposure for one shot area, the next shot area is moved to the scanning start position in accordance with the stepping of the substrate P. The exposure process is successively performed thereafter for each of the shot areas in the step-and-scan manner. This embodiment is designed so that the liquid 50 is allowed to flow in the same direction as the movement direction of the substrate in parallel to the movement direction of the substrate P.

Figure 4:
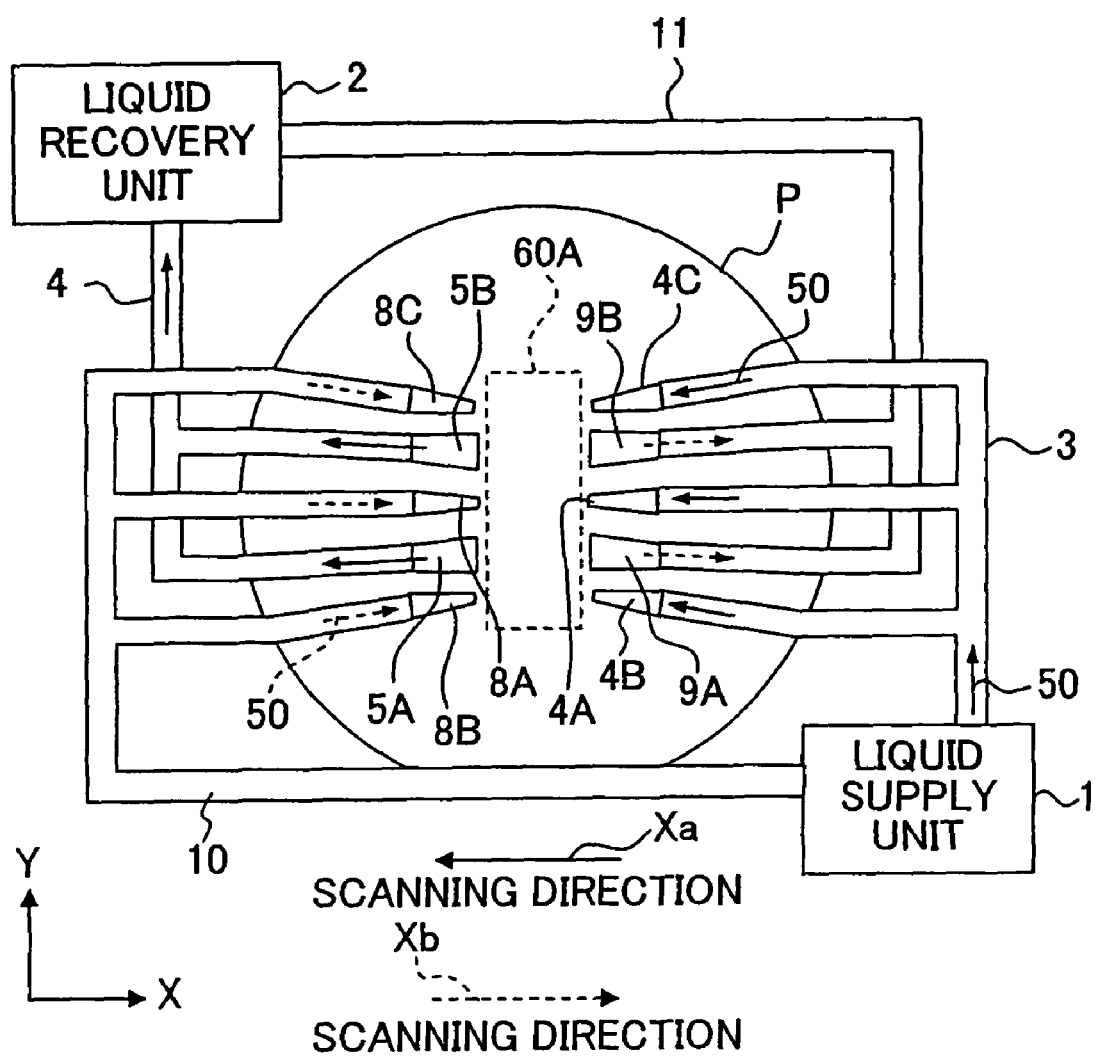
FIG. 4 shows an exemplary arrangement of supply nozzles and recovery nozzles.

FIG. 4 shows the positional relationship among the end portion 60A of the lens 60 of the projection optical system PL, the supply nozzles 4 (4A to 4C) for supplying the liquid 50 in the X axis direction, and the recovery nozzles 5 (5A, 5B) for recovering the liquid 50. In FIG. 4, the end portion 60A of the lens 60 has a rectangular shape which is long in the Y axis direction. The three supply nozzles 4A to 4C are arranged on the side in the +X direction, and the two recovery nozzles 5A, 5B are arranged on the side in the −X direction so that the end portion 60A of the lens 60 of the projection optical system PL is interposed thereby. The supply nozzles 4A to 4C are connected to the liquid supply unit 1 via the supply tube 3, and the recovery nozzles 5A, 5B are connected to the liquid recovery unit 2 via the recovery tube 4. Further, the supply nozzles 8A to 8C and the recovery nozzles 9A, 9B are arranged at positions obtained by rotating, by substantially 180°, the positions of the supply nozzles 4A to 4C and the recovery nozzles 5A, 5B about the center of the end portion 60A. The supply nozzles 4A to 4C and the recovery nozzles 9A, 9B are alternately arranged in the Y axis direction. The supply nozzles 8A to 8C and the recovery nozzles 5A, 5B are alternately arranged in the Y axis direction. The supply nozzles 8A to 8C are connected to the liquid supply unit 1 via the supply tube 10. The recovery nozzles 9A, 9B are connected to the liquid recovery unit 2 via the recovery tube 11. The liquid is supplied from the nozzles so that no gas portion is generated between the projection optical system PL and the substrate P.

When the scanning exposure is performed by moving the substrate P in the scanning direction (−X direction) indicated by the arrow Xa (see FIG. 4) in the main body of exposure apparatus EX, the liquid 50 is supplied and recovered with the liquid supply unit 1 and the liquid recovery unit 2 by using the supply tube 3, the supply nozzles 4A to 4C, the recovery tube 4, and the recovery nozzles 5A, 5B. That is, when the substrate P is moved in the −X direction, then the liquid 50 is supplied to the space between the projection optical system PL and the substrate P from the liquid supply unit 1 by the aid of the supply tube 3 and the supply nozzles 4 (4A to 4C), and the liquid 50 is recovered to the liquid recovery unit 2 by the aid of the recovery nozzles 5 (5A, 5B) and the recovery tube 6. The liquid 50 flows in the −X direction so that the space between the lens 60 and the substrate P is filled therewith. On the other hand, when the scanning exposure is performed by moving the substrate P in the scanning direction (+X direction) indicated by the arrow Xb, then the liquid 50 is supplied and recovered with the liquid supply unit 1 and the liquid recovery unit 2 by using the supply tube 10, the supply nozzles 8A to 8C, the recovery tube 11, and the recovery nozzles 9A, 9B. That is, when the substrate P is moved in the +X direction, then the liquid 50 is supplied from the liquid supply unit 1 to the space between the projection optical system PL and the substrate P by the aid of the supply tube 10 and the supply nozzles 8 (8A to 8C), and the liquid 50 is recovered to the liquid recovery unit 2 by the aid of the recovery nozzles 9 (9A, 9B) and the recovery tube 11. The liquid 50 flows in the +X direction so that the space between the lens 60 and the substrate P is filled therewith. As described above, the control unit CONT allows the liquid 50 to flow in the movement direction of the substrate P by using the liquid supply unit 1 and the liquid recovery unit 2. In this arrangement, for example, the liquid 50, which is supplied from the liquid supply unit 1 via the supply nozzles 4, flows so that the liquid 50 is attracted and introduced into the space 56 in accordance with the movement of the substrate P in the −X direction. Therefore, even when the supply energy of the liquid supply unit 1 is small, the liquid 50 can be supplied to the space 56 with ease. When the direction, in which the liquid 50 is allowed to flow, is switched depending on the scanning direction, then it is possible to fill the space between the substrate P and the tip surface 7 of the lens 60 with the liquid 50, and it is possible to obtain the high resolution and the wide depth of focus, even when the substrate P is subjected to the scanning in any one of the +X direction and the −X direction.

Next, an explanation will be made with reference to FIG. 5 about the liquid-removing unit 100 to be used for the exposure apparatus of the first embodiment. The liquid-removing unit 100 is provided at an intermediate position of the transport passage of the transport system H, and it removes the liquid 50 adhered to the substrate P after being subjected to the exposure process in accordance with the liquid immersion method. In this embodiment, the liquid-removing unit 100 is provided between the second transport unit H2 and the third transport unit H3. The liquid-removing unit 100 includes a stage unit 20, a holder 21 which is provided on the stage unit 20 and which holds a lower surface central portion of the substrate P, and a rotating mechanism 22 which rotates the holder 21 that holds the substrate P. A vacuum attraction hole, which constitutes a part of a vacuum unit, is provided through the upper surface of the holder 21. The holder 21 attracts and holds the lower surface central portion of the substrate P. The rotating mechanism 22 is constructed by a motor which is provided in the stage unit 20. The rotating mechanism 22 rotates the holder 21 by rotating a shaft 23 which is connected to the holder 21. The stage unit 20, the holder 21, and the rotating mechanism 22 are provided in a chamber 25 which serves as a cover mechanism. A liquid-sucking unit 29 is provided for the chamber 25 via a flow passage 28. The flow passage 28 is provided with a valve 28A.

The holder 21 is provided movably upwardly and downwardly with respect to the upper surface of the stage unit 20 together with the shaft 23. When the holder 21, which holds the substrate P, is moved upwardly with respect to the stage unit 20, then the substrate P is separated from the stage unit 20, and the substrate P is movable in accordance with the driving of the rotating mechanism 22. On the other hand, when the holder 21 is moved downwardly, the substrate P is retained by a second holder 24 which is provided on the upper surface of the stage unit 20.

The chamber 25 is provided with a first opening 26 which is formed on the side of the second transport unit H2, and a second opening 27 which is formed on the side of the third transport unit H3. A first shutter 26A, which opens/closes the first opening 26, is provided for the first opening 26. A second shutter 27A, which opens/closes the second opening 27, is provided for the second opening 27. The opening/closing operations of the first and second shutters 26A, 27A are controlled by the control unit CONT. When the first shutter 26A is opened, the second transport unit H2 is accessible to the stage unit 20 of the liquid-removing unit 100 via the first opening 26. That is, the second transport unit H2 is capable of transporting (importing) the substrate P to the stage unit 20 of the liquid-removing unit 100 via the first opening 26. The third transport unit H3 is accessible to the stage unit 20 of the liquid-removing unit 100 via the second opening 27. That is, the third transport unit H3 is capable of transporting (exporting) the substrate P to the stage unit 20 of the liquid-removing unit 100 via the second opening 27. On the other hand, when the first and second shutters 26A, 27A are closed, the interior of the chamber 25 is tightly closed.

Next, an explanation will be made with reference to FIGS. 1 and 2 about the operation of the device-producing system SYS provided with the main body of the exposure apparatus EX and the liquid-removing unit 100 described above.

The substrate P, which is held by the substrate stage PST1 in the main body of exposure apparatus EX, is subjected to the exposure by using the liquid immersion method, concurrently with which the alignment mark is detected and the surface information (AF (autofocus)/AL (autoleveling) information) is measured for the substrate P retained by the substrate stage PST2. FIG. 1 shows a situation in which the substrate stage PST1 performs the exposure operation in the main body of exposure apparatus (exposure station) EX, and the substrate stage PST2 performs the measuring operation in the measuring station. In the main body of exposure apparatus, the liquid is supplied by the liquid supply unit 1, and the liquid is recovered by the liquid recovery unit 2. The optical path for the exposure light beam, which is disposed on the image plane side of the projection optical system PL, is filled with the liquid 50. When the exposure process is completed for the substrate P retained by the substrate stage PST1, then the liquid supply by the liquid supply unit 1 is stopped, and the liquid recovery is performed by the liquid recovery unit 2. When the liquid recovery by the liquid recovery unit 2 is completed, then the substrate stage PST1 is retracted from the main body of exposure apparatus EX, and the substrate stage PST2, for which the various measurements have been completed, is introduced into the main body of exposure apparatus (exposure station) EX. The substrate P, for which the exposure process is completed on the substrate stage PST1, is unloaded from the substrate stage PST1 to the second transport unit H2. The substrate stage PST1, from which the substrate P is completely unloaded after the exposure process, receives the unexposed substrate P from the first transport unit H1 to start the various measurements on the measuring station. A slight amount of the liquid 50, which is not completely recovered by the liquid recovery unit 2, adheres to the substrate P unloaded to the second transport unit H2. The substrate P is transported to the liquid-removing unit 100 by the second transport unit H2. Thus, the liquid-removing unit 100 removes the liquid remaining on the substrate P for which the exposure process has been just completed, concurrently with the exposure process for the substrate P retained by the substrate stage PST2 and the various measurements for the substrate P retained by the substrate stage PST1.

When the supply of the liquid is started from the liquid supply unit 1 onto the substrate P retained on the substrate stage PST2, then the substrate stage PST1 may be only moved without performing any substantial measuring operation with the substrate stage PST1, or the substrate stage PST1 may be simply stopped. By doing so, it is possible to avoid the influence on the measuring operation for the substrate stage PST1 in the measuring station, which would be otherwise exerted by the vibration generated when the supply of the liquid is started from the liquid supply unit 1 onto the substrate stage PST2. When the supply of the liquid onto the substrate stage PST2 is stopped, if the measuring operation for the substrate stage PST1 has not been completed in the measuring station, then the substrate stage PST1 may be only moved, or the substrate stage PST1 may be simply stopped, without performing any substantial measuring operation for the substrate stage PST1 when the supply of the liquid is stopped.

Figure 5:
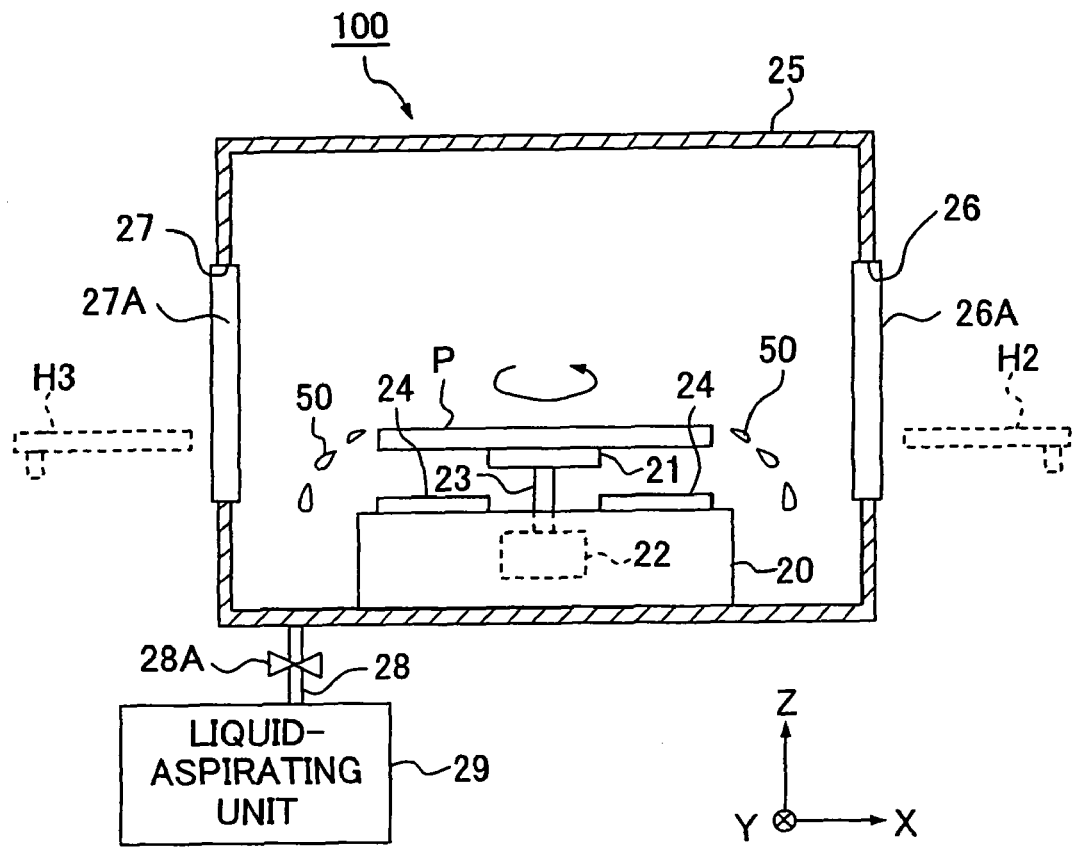
FIG. 5 shows a schematic arrangement illustrating an embodiment of a liquid-removing unit according to the present invention.

The control unit CONT opens the first shutter 26A as the second transport unit H2 approaches the liquid-removing unit 100 (see FIG. 5). In this situation, the second shutter 27A is closed. The second transport unit H2 delivers the substrate P to the stage unit 20 of the liquid-removing unit 100 via the first opening 26. In this situation, the holder 21 is moved downwardly, and the substrate P is retained by the holder 21 and the second holder 24 on the stage unit 20.

After the second transport unit H2 delivers the substrate P to the stage unit 20, the second transport unit H2 is retracted from the chamber 25 via the first opening 26. When the second transport unit H2 is retracted from the chamber 25, the control unit CONT closes the first shutter 26A. Accordingly, the interior of the chamber 25 is tightly closed. When the interior of the chamber 25 is tightly closed, the control unit CONT moves the holder 21 upwardly. As the holder 21 is moved upwardly, the substrate P, which is attracted and retained by the holder 21, is also moved upwardly with respect to the stage unit 20. The control unit CONT drives the rotating mechanism 22 to rotate the holder 21 in the θz direction together with the substrate P. As the rotating mechanism 22 rotates the substrate P, the liquid 50, which is adhered to the both upper and lower surfaces of the substrate P, blown off from the substrate P in accordance with the action of the centrifugal force. Accordingly, the liquid 50, which is adhered to the substrate P, is removed from the substrate P. In this arrangement, the substrate P is arranged in the chamber 25 which serves as the cover mechanism. Therefore, the liquid 50, which is blown off from the substrate P, is not scattered to the surroundings.

The liquid 50, which is blown off from the substrate P, is recovered by the liquid-sucking unit 29 which is connected to the chamber 25. The liquid-sucking unit 29 recovers the liquid 50 blown off from the substrate P by sucking the gas contained in the chamber 25 together with the scattered liquid 50. In this procedure, the liquid-sucking unit 29 continuously performs the operation for sucking the gas contained in the chamber 25 and the scattered liquid 50. Accordingly, the liquid 50 does not stay in the chamber 25 including, for example, the inner wall and the bottom of the chamber 25. Therefore, the humidity in the chamber 25 is not greatly varied. Any wet gas contained in the chamber 25 does not outflow to the outside of the chamber 25, when the shutters 26A, 27A are opened as well.

When the substrate P is rotated for a predetermined period of time (or by a predetermined number of revolutions), then the control unit CONT stops the driving of the rotating mechanism 22, and the substrate P is moved downwardly together with the holder 21. Subsequently, the control unit CONT opens the second shutter 27A. When the second shutter 27A is opened, the third transport unit (second transport member) H3 makes the access to the stage unit 20 via the second opening 27 to retain the substrate P which is disposed on the stage unit 20 and from which the liquid 50 has been removed. The third transport unit H3, which retains the substrate P from which the liquid 50 has been removed by the liquid-removing unit 100, exports the substrate P from the interior of the chamber 25 via the second opening 27.

As shown in FIG. 1, the substrate P, from which the liquid 50 has been removed by the liquid-removing unit 100, is carried to the main coater-developer body C/D through the interface section IF. The main coater-developer body C/D (developing unit D) applies the developing process to the delivered substrate P. As described above, the exposure apparatus EX-SYS of this embodiment removes the liquid 50 adhered to the substrate P by the liquid-removing unit 100 before the substrate P is transported to the coater-developer apparatus CD-SYS through the interface section IF.

As explained above, the liquid 50, which is adhered to the substrate P, is removed by the liquid-removing unit 100 before the substrate P, to which the exposure process has been applied by the main body of exposure apparatus EX, is transported to the coater-developer apparatus C/D-SYS (developing unit D). Therefore, it is possible to exclude the influence of the liquid 50 on the developing process. When the liquid 50, which is adhered to the substrate P, is removed by the liquid-removing unit 100, it is possible to suppress the occurrence of inconveniences which would be otherwise caused, for example, such that the liquid falls from the substrate P during the transport of the substrate P, the humidity change (environmental change) is caused in the first chamber unit CH1, and the rust appears on the members and the respective units or apparatuses disposed on the transport passage.

The substrate P, to which the liquid 50 is adhered, is transported by the second transport unit H2, and the substrate P, from which the liquid 50 has been removed, is transported by the third transport unit H3 which is provided separately from the second transport unit H2. Therefore, the third transport unit H3 is not exposed to the liquid 50. Therefore, the liquid 50 is not adhered to the substrate P which is transported by the third transport unit H3. Further, it is possible to reliably avoid the scattering of the liquid 50 on the transport passage of the third transport unit H3.

The liquid-removing unit 100 is provided at the intermediate position of the transport passage of the transport system H. Therefore, it is possible to simultaneously perform the exposure process with the main body of exposure apparatus EX and the liquid-removing process with the liquid-removing unit 100. Therefore, it is possible to execute the respective processes without degrading the throughput. Further, the liquid-removing process is performed in the chamber 25. Therefore, it is possible to avoid the scattering of the liquid 50 to the surroundings.

This embodiment has been explained such that the transport is performed via the interface section IF as the connecting section when the substrate P after the exposure process is transported to the coater-developer apparatus C/D-SYS as the processing apparatus. However, the opening of the first chamber unit CH1 serves as the connecting section for the exposure apparatus EX-SYS, for example, when the interface section IF is provided for the coater-developer apparatus C/D-SYS, when the coater-developer apparatus C/D-SYS is directly connected to the exposure apparatus EX-SYS without using the interface section IF, or when the processing apparatus is a substrate-accommodating apparatus, and the substrate P after the exposure process is transported to the substrate-accommodating apparatus without using the interface section IF.

As described above, the liquid 50 is composed of pure water in this embodiment. Pure water is advantageous in that pure water is available in a large amount with ease, for example, in the semiconductor production factory, and pure water exerts no harmful influence, for example, on the optical element (lens) and the photoresist on the substrate P. Further, pure water exerts no harmful influence on the environment, and the content of impurity is extremely low. Therefore, it is also expected to obtain the function to wash the surface of the substrate P and the surface of the optical element provided at the tip surface of the projection optical system PL.

It is approved that the refractive index n of pure water (water) with respect to the exposure light beam EL having a wavelength of about 193 nm is approximately in an extent of 1.44 to 1.47. When the ArF excimer laser beam (wavelength: 193 nm) is used as the light source of the exposure light beam EL, then the wavelength is shortened on the substrate P by 1/n, i.e., to about 131 to 134 nm, and a high resolution is obtained. Further, the depth of focus is magnified about n times, i.e., about 1.44 to 1.47 times as compared with the value obtained in the air. Therefore, when it is enough to secure an approximately equivalent depth of focus as compared with the case of the use in the air, it is possible to further increase the numerical aperture of the projection optical system PL. Also in this viewpoint, the resolution is improved.

In this embodiment, the lens 60 is attached to the tip of the projection optical system PL. However, the optical element, which is attached to the tip of the projection optical system PL, may be an optical plate which is usable to adjust the optical characteristics of the projection optical system PL, for example, the aberration (for example, spherical aberration and comatic aberration). Alternatively, the optical element may be a parallel plane plate through which the exposure light beam EL is transmissive. When the optical element, which makes contact with the liquid 50, is the parallel plane plate which is cheaper than the lens, it is enough that the parallel plane plate is merely exchanged immediately before supplying the liquid 50 even when any substance (for example, any silicon-based organic matter), which deteriorates the transmittance of the projection optical system PL, the illuminance of the exposure light beam EL on the substrate P, and the uniformity of the illuminance distribution, is adhered to the parallel plane plate, for example, during the transport, the assembling, and/or the adjustment of the exposure apparatus EX. An advantage is obtained such that the exchange cost is lowered as compared with the case in which the optical element to make contact with the liquid 50 is the lens. That is, the surface of the optical element to make contact with the liquid 50 is dirtied, for example, due to the adhesion of scattered particles generated from the resist by being irradiated with the exposure light beam EL or any impurity contained in the liquid 50. Therefore, it is necessary to periodically exchange the optical element. However, when the optical element is the cheap parallel plane plate, then the cost of the exchange part is low as compared with the lens, and it is possible to shorten the time required for the exchange. Thus, it is possible to suppress the increase in the maintenance cost (running cost) and the decrease in the throughput.

When the pressure, which is generated by the flow of the liquid 50, is large between the substrate P and the optical element disposed at the tip of the projection optical system PL, it is also allowable that the optical element is tightly fixed so that the optical element is not moved by the pressure, without allowing the optical element to be exchangeable.

This embodiment is constructed such that the space between the projection optical system PL and the surface of the substrate P is filled with the liquid 50. However, the space may be filled with the liquid 50, for example, in a state in which a cover glass composed of a parallel plane plate is attached to the surface of the substrate P.

In the embodiment described above, the shape of the nozzle is not specifically limited. For example, the liquid 50 may be supplied or recovered by using two pairs of nozzles for the long side of the end portion 60A. In this arrangement, the supply nozzles and the recovery nozzles may be arranged and aligned vertically in order to supply and recover the liquid 50 from any one of the directions of the +X direction and the −X direction.

Second Embodiment

Next, an explanation will be made with reference to FIG. 6 about a liquid-removing unit 100 to be used for an exposure apparatus according to a second embodiment of the present invention. In the following explanation, those other than the liquid-removing unit 100 are the same as or equivalent to those of the first embodiment, any explanation of which will be simplified or omitted.

Figure 6:
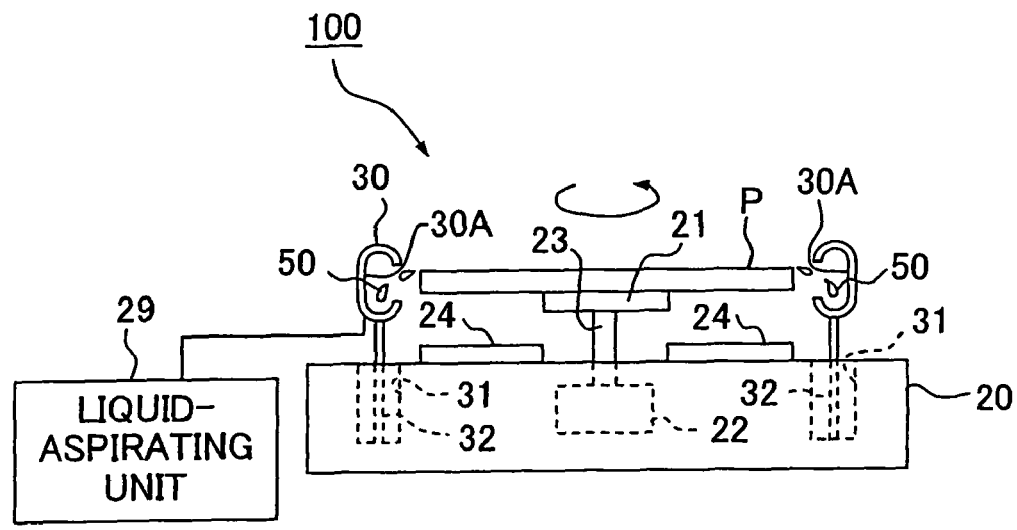
FIG. 6 shows a schematic arrangement illustrating another embodiment of a liquid-removing unit according to the present invention.

With reference to FIG. 6, the liquid-removing unit 100 includes a cover 30 which constitutes a part of a cover mechanism for covering the surroundings of the substrate P so that the liquid 50 is not scattered when the liquid 50 adhered to the substrate P is removed. In this embodiment, the liquid-removing unit 100 does not have the chamber 25. The cover 30 is formed to be approximately annular as viewed in a plan view. The cover 30 has a pocket 30A provided in the annular section. The liquid-sucking unit 29 is connected to the pocket 30A of the cover 30. The cover 30 can be arranged in a recess 31 which is formed in the stage unit 20. The cover 30 is movable upwardly and downwardly (capable of protruding and retracting) with respect to the stage unit 20 by the aid of a lifting mechanism 32. When the liquid-removing process is performed, the cover 30 is also moved upwardly together with the upward movement of the holder 21. The cover 30 is provided to cover the surroundings of the substrate P. Therefore, the liquid 50, which is blown off by the rotation of the substrate P, is recovered by the pocket 30A of the cover 30. The liquid 50, which is recovered by the pocket 30A, is recovered by the liquid-sucking unit 29.

As explained above, the cover 30, which covers the surroundings of the substrate P, can be also used as the cover mechanism. Accordingly, it is possible to avoid the scattering of the liquid 50 to the surroundings by the simple structure as compared with the chamber 25 explained in the first embodiment.

Third Embodiment

Next, an explanation will be made with reference to FIG. 7 about a liquid-removing unit 100 to be used for an exposure apparatus according to a third embodiment. This embodiment is characterized in that the rotating mechanism 22 and the cover 30, which constitute the liquid-removing unit 100, are provided in a substrate stage PST of a main body of exposure apparatus EX for performing the exposure process. The structure of the main body of the exposure apparatus EX is equivalent to that described in the first embodiment, any explanation of which will be omitted.

Figure 7A:
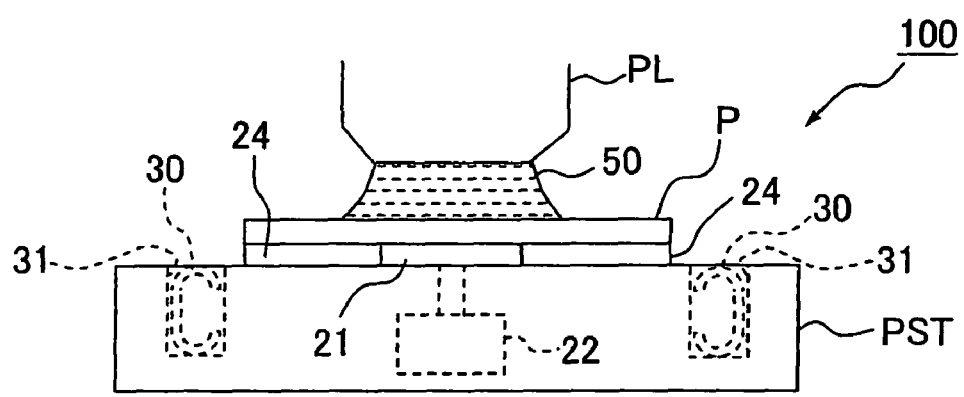
FIGS. 7A and 7B show a schematic arrangement illustrating still another embodiment of a liquid-removing unit according to the present invention.
Figure 7B:
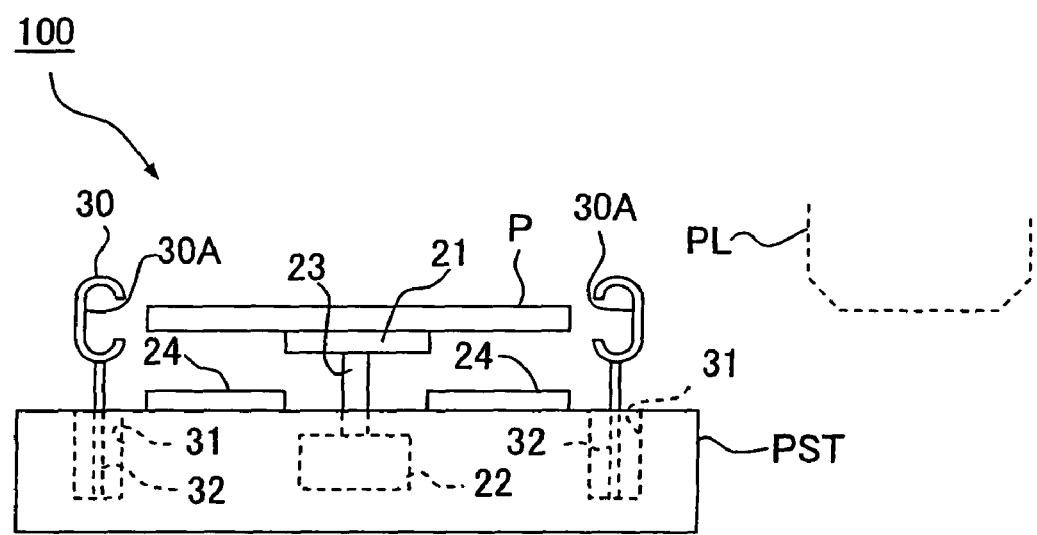

With reference to FIG. 7A, the substrate stage PST includes the holder 21 and the second holder 24 for supporting the substrate P, and a recess 31 capable of accommodating the cover 30. As shown in FIG. 7A, the image of the pattern is transferred via the projection optical system PL and the liquid 50 onto the substrate P retained by the holder 21 and the second holder 24. When the exposure process is completed for the substrate P, then the control unit CONT stops the supply of the liquid 50 from the liquid supply unit 1 to the space between the projection optical system PL and the substrate P, and the liquid 50 on the substrate P is recovered by the liquid recovery unit 2 as shown in FIG. 7B. When the recovery operation is completed, the substrate stage PST is retracted from the position just under the projection optical system PL. Subsequently, the control unit CONT upwardly moves the holder 21 which retains the substrate P, and the control unit CONT upwardly moves the cover 30. The control unit CONT drives the rotating mechanism 22 to rotate the substrate P. Accordingly, the liquid 50, which is adhered to the substrate P as a result of any incomplete recovery by the liquid recovery unit 2, is removed from the substrate P. After the liquid 50 adhered to the substrate P is removed, the second transport unit H2 exports the substrate P from the substrate stage PST.

As explained above, the liquid-removing unit 100 can be also provided in the substrate stage PST. When the liquid adhered to the substrate P is removed before the substrate P is exported from the substrate stage PST on which the exposure process is performed, it is possible to suppress the occurrence of any inconvenience which would be otherwise caused such that the liquid 50 falls from the substrate P during the transport of the substrate P. In this embodiment, the main body of exposure apparatus EX adopts the twin-stage system. Therefore, it is possible to simultaneously perform the exposure process on the first substrate stage PST1 and the liquid-removing process on the second substrate stage PST2. It is possible to execute the entire process without degrading the throughput.

The third embodiment adopts the mechanism for rotating the substrate P in order to remove the liquid adhered to the substrate P before the substrate P after the exposure process is transported from the substrate stage PST. Alternatively, it is also allowable to provide a blower to blow off the liquid. Further alternatively, it is also allowable to provide a mechanism for sucking the remaining liquid on the substrate P separately from the liquid recovery unit 2. These alternatives may be used in combination.

Fourth Embodiment

Figure 8:
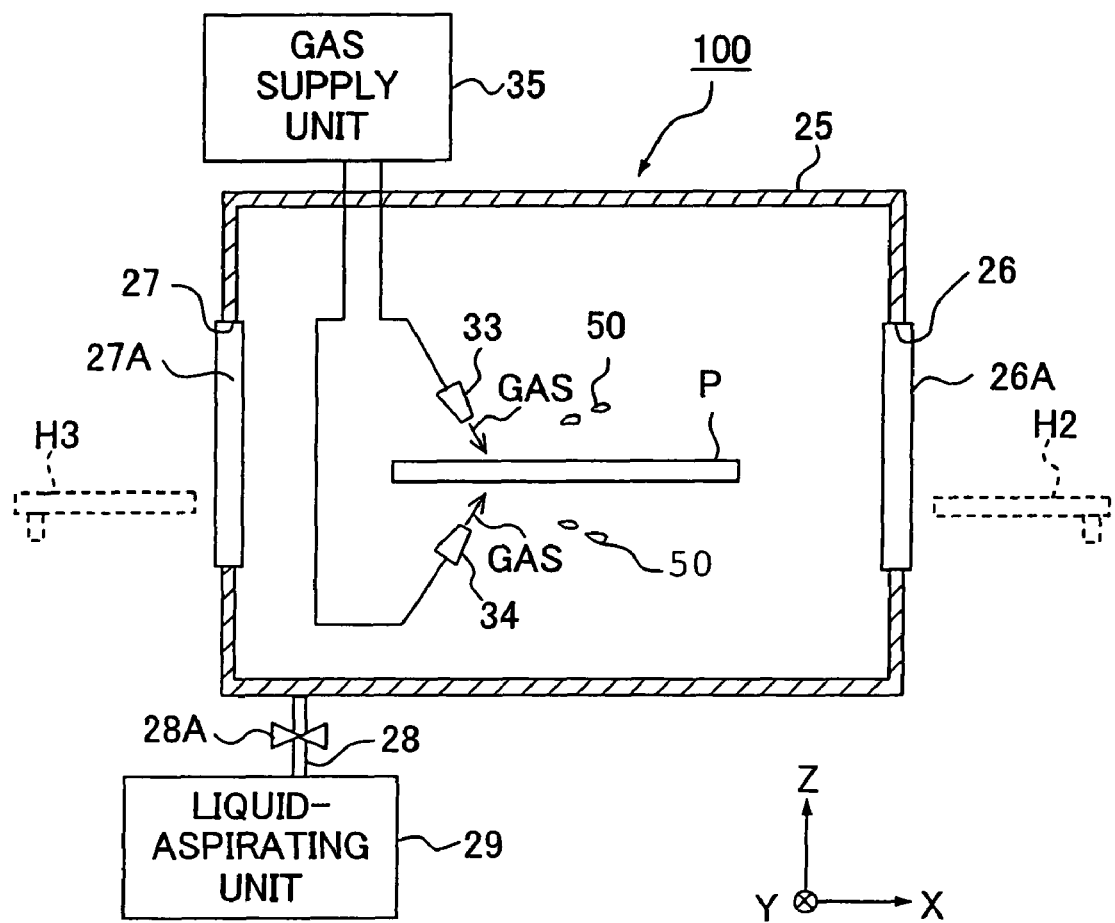
FIG. 8 shows a schematic arrangement illustrating still another embodiment of a liquid-removing unit according to the present invention.

Next, an explanation will be made with reference to FIG. 8 about a liquid-removing unit 100 to be used for an exposure apparatus according to a fourth embodiment. The liquid-removing unit 100 shown in FIG. 8 is provided between the second transport unit H2 and the third transport unit H3 at an intermediate position of the transport passage of the transport system H, and includes a chamber 25. The structure of the main body of the exposure apparatus EX is equivalent to that described in the first embodiment, any explanation of which will be omitted.

With reference to FIG. 8, the liquid-removing unit 100 includes a first blow section 33 which allows the gas to blow against the front surface (upper surface) of the substrate P to remove the liquid 50 by blowing off the liquid 50 adhered to the front surface of the substrate P, and a second blow section 34 which allows the gas to blow against the back surface (lower surface) of the substrate P to remove the liquid 50 by blowing off the liquid 50 adhered to the back surface of the substrate P. The first and second blow sections 33, 34 are connected to a gas supply unit 35 via flow passages respectively. A filter is provided in each of the flow passages to remove foreign matters (dust and oil mist) contained in the gas to be blown against the substrate P. The gas supply unit 35 supplies the dry gas to the first and second blow sections 33, 34. In this embodiment, the gas supply unit 35 supplies the dry air.

Figure 9:
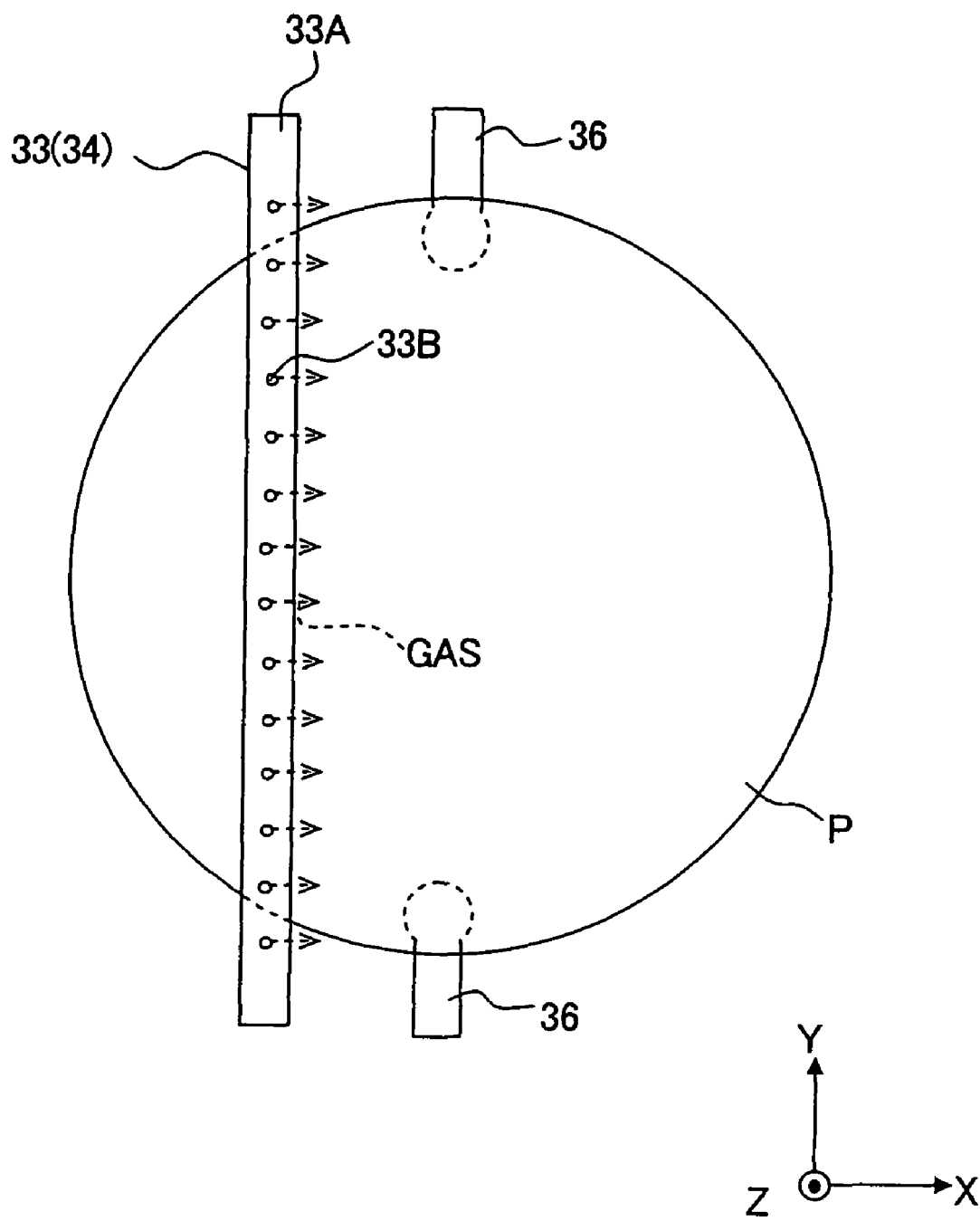
FIG. 9 shows a schematic arrangement illustrating still another embodiment of a liquid-removing unit according to the present invention.

FIG. 9 shows a view in which the interior of the chamber 25 shown in FIG. 8 is viewed from an upper position. As shown in FIG. 9, the substrate P is held by a holding unit 36 at both ends in the Y axis direction of the lower surface thereof (holding unit 36 is not shown in FIG. 8). The substrate P is delivered to the holding unit 36 from the second transport unit H2, and the holding unit 36 holds the delivered substrate P. It is arranged that the substrate P, which is held by the holding unit 36, is delivered to the third transport unit H3. The first blow section 33 includes a nozzle main section 33A which has a longitudinal direction thereof in the Y axis direction, and a plurality of nozzle holes 33B which are provided and aligned in the longitudinal direction of the nozzle main section 33A. The dry air, which is supplied from the gas supply unit 35, is blown from the plurality of nozzle holes 33B respectively. The second blow section 34 is also constructed equivalently to the first blow section 33, which includes a nozzle main section having a longitudinal direction thereof in the Y axis direction, and a plurality of nozzle holes.

The substrate P held by the holding unit 36 and the first and second blow sections 33, 34 are provided relatively movably. In this embodiment, the first and second blow sections 33, 34 make scanning movement in the X axis direction with respect to the substrate P held by the holding unit 36. Alternatively, a driving unit may be provided for the holding unit 36 to move the substrate P with respect to the first and second blow sections 33, 34. Further alternatively, both of the first and second blow sections 33, 34 and the holding unit 36 may be moved.

Next, an explanation will be made about the operation of the liquid-removing unit 100 constructed as described above. The second transport unit H2 delivers, to the holding unit 36, the substrate P to which the liquid 50 is adhered. The control unit CONT allows the gas to blow from the first and second blow sections 33, 34 against the substrate P held by the holding unit 36. In this embodiment, the gas, which is supplied from the first and second blow sections 33, 34, is blown in the inclined directions with respect to the front and back surfaces of the substrate P. The control unit CONT allows the gas to blow against the substrate P held by the holding unit 36 while moving the first and second blow sections 33, 34 in the X axis direction. In this embodiment, the length of the nozzle main section of each of the first and second blow sections 33, 34 is sufficiently larger than that of the substrate P. Therefore, the gas is blown uniformly against the entire front and back surfaces of the substrate P. When the gas is blown out, the liquid 50, which is adhered to the substrate P, is blown off and removed. The liquid 50, which has been blown off, is recovered by the liquid-sucking unit 29. The substrate P, from which the liquid 50 has been removed, is delivered to the third transport unit H3.

Fifth Embodiment

Figure 10:
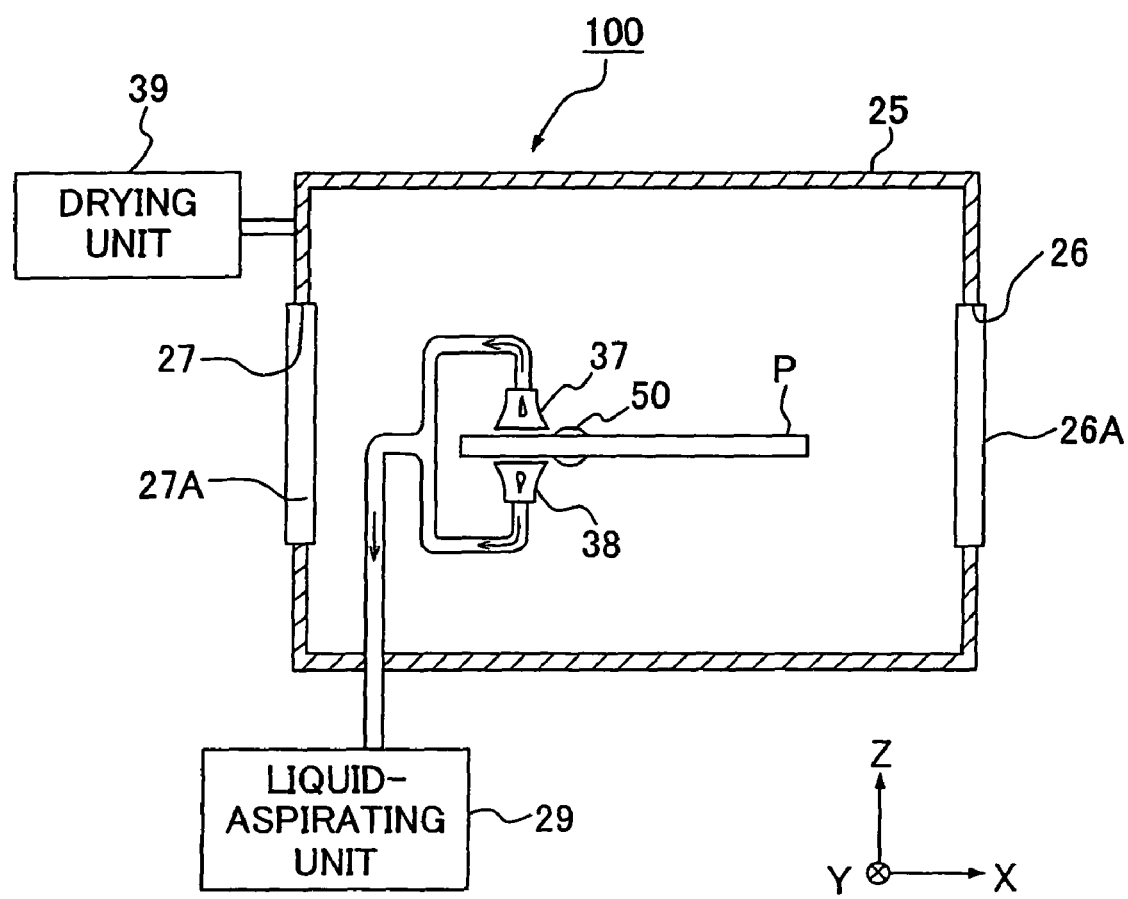
FIG. 10 shows a schematic arrangement illustrating still another embodiment of a liquid-removing unit according to the present invention.

Next, an explanation will be made with reference to FIG. 10 about a liquid-removing unit 100 to be used for an exposure apparatus according to a fifth embodiment. With reference to FIG. 10, the liquid-removing unit 100 includes first and second sucking sections 37, 38 which are connected to the liquid-sucking unit 29 via flow passages and which suck the liquid 50 adhered to the front surface and the back surface of the substrate P respectively, and a drying unit 39 which dries the interior of the chamber 25. The first and second sucking sections 37, 38 are provided relatively movably in the X axis direction with respect to the substrate P. When the liquid 50 adhered to the substrate P is removed, the control unit CONT drives the liquid-sucking unit 29 in a state in which the first and second sucking sections 37, 38 approach the substrate P. Accordingly, the liquid 50, which is adhered to the substrate P, is sucked into the liquid-sucking unit 29 by the aid of the first and second sucking sections 37, 38. The sucking operation is performed by the liquid-sucking unit 29 while moving the first and second sucking sections 37, 38 in the X direction with respect to the substrate P, and thus the liquid 50 adhered to the substrate P is removed. In this procedure, the drying unit 39 supplies the dry gas (dry air) into the chamber 25. The interior of the chamber 25 is dried by the driving of the drying unit 39. Accordingly, it is possible to facilitate the removal of the liquid 50 from the substrate P. The structure of the main body of the exposure apparatus EX is equivalent to that described in the first embodiment, any explanation of which will be omitted.

It is also allowable to simultaneously execute the sucking operation for sucking the liquid 50 on the substrate P as explained with reference to FIG. 10 and the gas-blowing operation from the blow sections as explained with reference to FIG. 8. Alternatively, any one of the sucking operation and the gas-blowing operation may be executed, and the other may be executed thereafter. The drying operation by the drying unit 39 may be performed concurrently as well. The drying operation may be also performed before and/or after the sucking operation and/or the gas-blowing operation. That is, it is possible to appropriately combine and execute the sucking operation, the drying operation, and the gas-blowing operation (liquid-blowing off operation).

Sixth Embodiment

Figure 11:
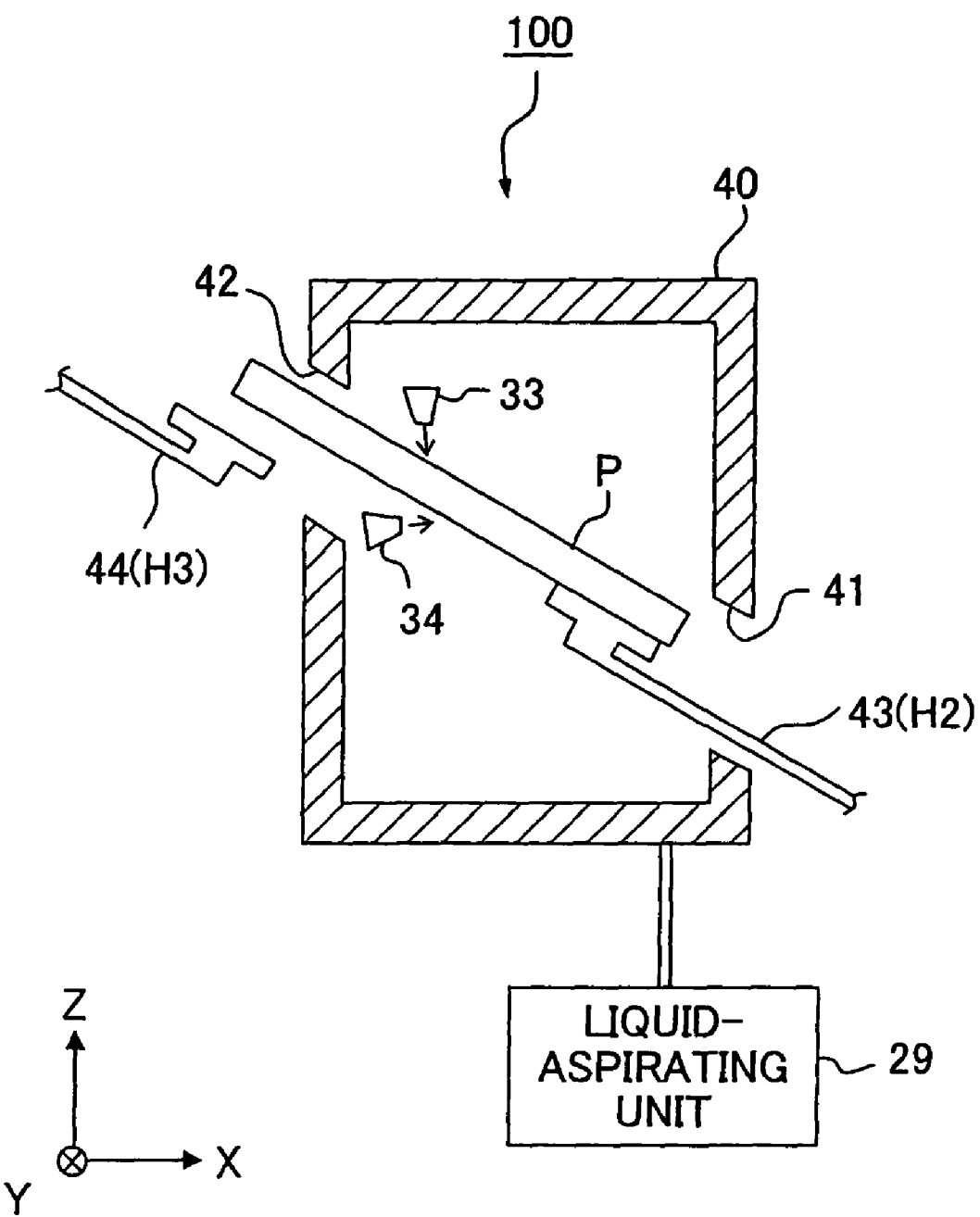
FIG. 11 shows a schematic arrangement illustrating still another embodiment of a liquid-removing unit according to the present invention.

Next, an explanation will be made with reference to FIG. 11 about a liquid-removing unit 100 of an exposure apparatus according to a sixth embodiment. The structure of the main body of the exposure apparatus EX is equivalent to that described in the first embodiment, any explanation of which will be omitted. With reference to FIG. 11, the liquid-removing unit 100 includes first and second blow sections 33, 34, and a chamber 40 which accommodates the first and second blow sections 33, 34. In this embodiment, the chamber 40 is provided with first and second openings 41, 42 which are formed by being deviated in the Z axis direction. In this embodiment, no shutter is provided for the first and second openings 41, 42. However, it is also possible to provide shutters respectively. In this embodiment, a second transport unit H2 includes an arm (first transport member) 43 which is capable of inserting the substrate P into the chamber via the first opening 41 while holding the substrate P. The arm 43 transports the substrate P to which the liquid 50 is adhered after the exposure process performed by the liquid immersion method in a state in which the substrate P is inclined by a predetermined angle with respect to the horizontal plane (XY plane), and the arm 43 inserts the substrate P into the chamber 40. The first opening 41, into which the arm 43 for holding the substrate P adhered with the liquid 50 is inserted, is formed on the lower side in the Z axis direction as compared with the second opening 42. The arm 43 transports the substrate P with the frontward side in the inserting direction with respect to the chamber 40 (frontward side in the transport direction) being directed upwardly.

The arm 43 moves the substrate P with respect to the first and second blow sections 33, 34 in a state in which the inclination of the substrate P is maintained. The first and second blow sections 33, 34 allow the gas to blow against the moving substrate P. The liquid 50, which is adhered to the substrate P, is removed by the gas blow. In this procedure, the substrate P is inclined. Therefore, the liquid 50 is easily moved by its self-weight toward the lower side in the direction of inclination of the substrate P. The removal of the liquid 50 from the substrate P is facilitated. The liquid 50, which is removed from the substrate P, stays in the chamber 40, and the liquid 50 is recovered by the liquid-sucking unit 29 as the recovery unit. Alternatively, the liquid 50 may be moved by the self-weight toward the downward side in the direction of inclination of the substrate P in a state in which the substrate P is inclined, and the gas may be allowed to blow against the liquid 50 collected on the downward side in the direction of inclination. Further alternatively, the drying operation as described above may be simultaneously used. That is, when the liquid is removed with the liquid-removing unit 100, it is also allowable to use any one of the methods of the rotation of the substrate P, the inclination of the substrate P, the sucking operation, the drying operation, and the gas-blowing operation (liquid-blowing off operation), or it is also allowable to appropriately combine them.

One end of the substrate P from which the liquid 50 has been removed protrudes to the outside of the chamber 40 from the second opening 42. An arm (second transport member) 44, which serves as a third transport unit H3, is provided in the vicinity of the second opening 42. The substrate P, from which the liquid 50 has been removed, is directly delivered from the arm 43 to the arm 44.

This embodiment has been explained such that the substrate P is transported while being inclined when the substrate P is inserted into the chamber 40. However, the substrate P, to which the liquid 50 is adhered, may be transported at any position other than those disposed in the chamber 40 in a state in which the substrate P is inclined by a predetermined angle with respect to the horizontal plane. Accordingly, the liquid 50 adhered to the substrate P falls from the substrate P by the self-weight. In this case, a recovery unit, which recovers the liquid 50 separated from the substrate P by the self-weight, is provided in the transport passage. The angle of inclination with respect to the horizontal plane, which is used when the substrate P is transported, can be arbitrarily established, which may be 90 degrees. That is, it is also possible to transport the substrate P in a state in which the substrate P is allowed to stand vertically.

In the respective embodiments described above, it is preferable that the surfaces of the arm 43 and the second transport unit H2 for transporting the substrate P to which the liquid 50 is adhered are liquid-repellent. Accordingly, even if the liquid 50 adhered to the substrate P is adhered to the second transport unit H2 (arm 43) when the substrate P is transported, the liquid 50 can be immediately and easily removed from the second transport unit H2 (arm 43). Therefore, it is possible to avoid the occurrence of such an inconvenience that the liquid 50 adhered to the second transport unit H2 (arm 43) is adhered (adhered again) to the substrate P. The liquid-repelling treatment (water-repelling treatment) for making the surface of the second transport unit H2 (arm 43) to be liquid-repellent includes, for example, a coating treatment in which a material having liquid repellence is used. The material having the liquid repellence includes, for example, fluorine-based compounds, silicon compounds, and synthetic resins such as polyethylene and acrylic resins. The thin film, which is to be used for the surface treatment, may be a single layer film or a film composed of a plurality of layers. The liquid-repelling treatment may be applied to the entire surface of the second transport unit H2 (arm 43), or the liquid-repelling treatment may be applied to a part thereof.

Seventh Embodiment

Figure 12:
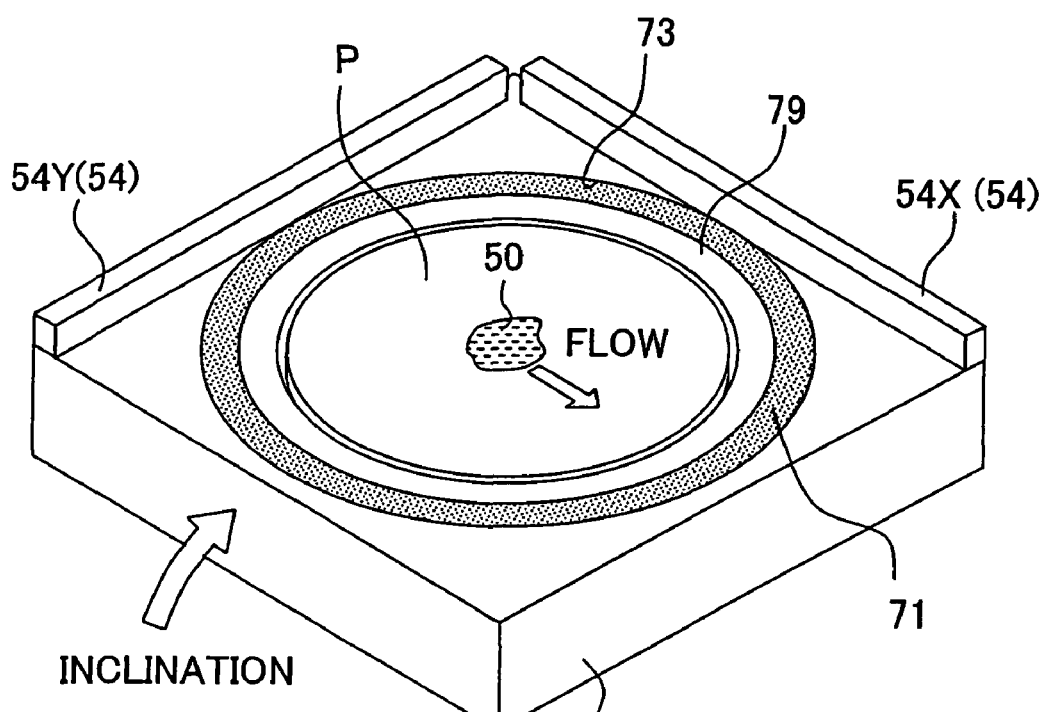
FIG. 12 shows a schematic arrangement illustrating still another embodiment of a liquid-removing unit according to the present invention.

In the embodiment having been explained with reference to FIG. 11, the substrate P is transported while being inclined, or the substrate P is inclined in the liquid-removing unit 100 provided at the intermediate position of the transport passage. However, as shown in FIG. 12, the liquid 50 may be removed by inclining a substrate stage PST (Z stage 51) which holds the substrate P adhered with the liquid 50, after completing the exposure for the substrate P and before transporting (unloading) the substrate P. With reference to FIG. 12, the substrate stage PST (Z stage 51) holds the substrate P at a substantially central portion of the upper surface. An annular liquid recovery port (recovery groove) 73 capable of recovering the liquid 50 is formed around the substrate P. A liquid-absorbing member 71 is arranged in the recovery groove 73. A flow passage, which has one end connected to the recovery groove 73 and which has the other end connected to a liquid recovery mechanism provided outside the Z stage 51, is formed in the Z stage 51. The liquid recovery mechanism includes, for example, a vacuum system (suction unit) such as a vacuum pump, and a tank for storing the recovered liquid. The liquid-absorbing member 71 is composed of, for example, a porous material such as porous ceramics and sponge, which is capable of retaining a predetermined amount of the liquid 50. An annular auxiliary plate 79, which has a predetermined width to surround the outer circumference of the substrate P, is provided between the substrate P held by the Z stage 51 and the liquid-absorbing member 71 (recovery groove 73). The surface height of the auxiliary plate 79 is set to be approximately coincident with the surface height of the substrate P held by the Z stage 51. The liquid-absorbing member 71 (recovery groove 73), which is arranged with the predetermined width to surround the outer circumference of the auxiliary plate 79, plays a role to absorb (recover) the liquid 50 having been incompletely recovered by the liquid recovery unit 2. With reference to FIG. 12, a movement mirror 54X, which extends in the Y axis direction, is provided at the end on the +X side of the Z stage 51, and a movement mirror 54Y, which extends in the X axis direction, is provided at the end on the Y side. Laser interferometers radiate laser beams onto the movement mirrors 54X, 54Y to detect the positions of the substrate stage PST in the X axis direction and in the Y axis direction.

The Z stage 51 is inclined by a leveling mechanism provided for the Z stage 51 before the substrate P is transported (unloaded) from the Z stage 51 (substrate stage PST) shown in FIG. 12 after the completion of the exposure for the substrate P. Accordingly, the substrate P, which is placed on the Z stage 51, is also inclined. By doing so, the liquid 50, which remains on the substrate P after the completion of the exposure, flows to the recovery groove 73 so that the liquid 50 is recovered in accordance with the action of the gravity (self-weight). When the operation for inclining the Z stage 51 is performed as the operation for recovering the liquid before the transport after the completion of the exposure, for example, if it is feared that the tip portion of the projection optical system PL may contact with the Z stage 51 (substrate P) as a result of the inclination of the Z stage 51, then the Z stage 51 (substrate stage PST) may be retracted from the position just under the projection optical system PL, and the inclining operation may be performed at a position separated from the projection optical system PL. In this embodiment, the substrate stage and the inclination control thereof function as the liquid-removing unit.

In the embodiment described above, the liquid on the substrate P is removed by inclining the substrate P in accordance with the inclination of the substrate stage PST (Z stage 51). However, as disclosed in Japanese Patent Application Laid-open No. 1-214042, when a substrate support member, which is movable upwardly and downwardly while holding the substrate P in order to load and unload the substrate P, is carried on the substrate stage PST, the substrate P may be inclined in accordance with the inclination of the substrate support member. The substrate P may be dried by allowing the dry air or the warm air to blow thereagainst, before the substrate P is exported from the substrate stage PST. That is, when the liquid is removed before the substrate P is exported from the substrate stage PST, it is also allowable to use any one of the methods of the rotation of the substrate P, the blowing off of the liquid, the suction of the liquid, the inclination of the substrate P, and the drying by allowing the gas to blow, or it is also allowable to appropriately combine and use them.

Eighth Embodiment

Next, an explanation will be made with reference to FIG. 13 about an exposure apparatus according to an eighth embodiment of the present invention. This embodiment is characterized in that the liquid-removing unit 100 is provided, and a washing unit 150, which washes the substrate P after the exposure process with a washing liquid, is provided at an intermediate position of the transport passage between the main body of the exposure apparatus EX and the liquid-removing unit 100. In this embodiment, the main body of the exposure apparatus is constructed in the same manner as in the first embodiment except that the single substrate stage PST is used.

Figure 13:
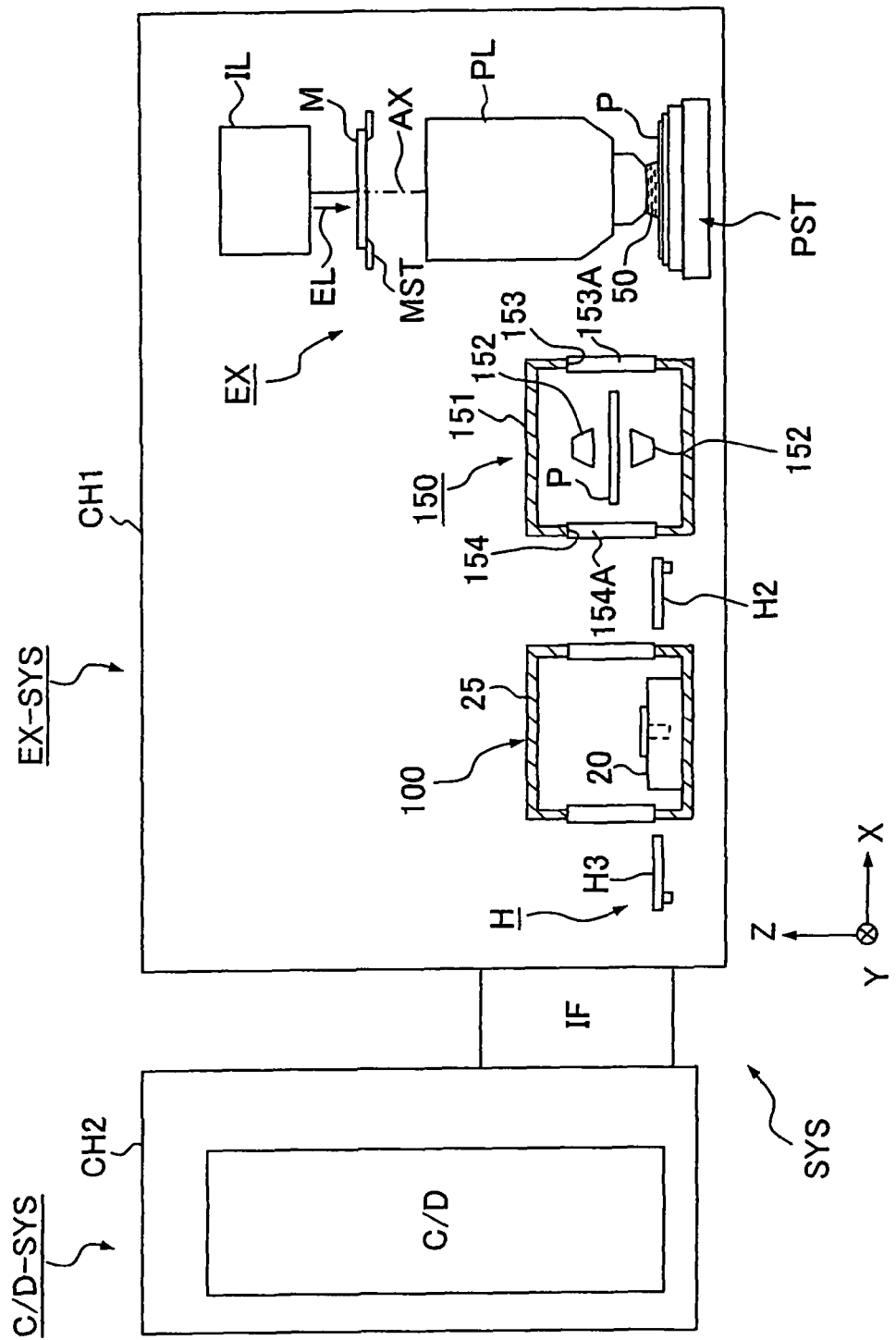
FIG. 13 shows another embodiment of a device-producing system as an exposure apparatus of the present invention.

With reference to FIG. 13, the washing unit 150 includes a chamber 151, and a washing liquid supply unit 152 which is provided in the chamber 151 and which supplies the washing liquid to the substrate P transported into the chamber 151. The washing liquid supply unit 152 supplies the washing liquid to the upper surface and the lower surface of the substrate P respectively. The chamber 151 is provided with a first opening 153 which is open on the side of the main body of exposure apparatus EX and a second opening 154 which is open on the side of the liquid-removing unit 100. The first and second openings 153, 154 are provided with shutters 153A, 154A which open/close the first and second openings 153, 154 respectively. The substrate P after the exposure process performed by the main body of exposure apparatus EX is transported by a fifth transport unit (not shown) via the first opening 153 into the chamber 151 of the washing unit 150. A holding unit for holding the substrate P is provided in the chamber 151. The substrate P is subjected to the washing process with the washing liquid in a state of being held by the holding unit. The substrate P, which has been subjected to the washing process, is transported to the liquid-removing unit 100 by the second transport unit H2. The liquid-removing unit 100 removes the washing liquid adhered to the substrate P.

In the present invention, any liquid other than water can be used as the liquid 50 for the exposure process performed by the main body of exposure apparatus EX based on the liquid immersion method. In this embodiment, a fluorine-based oil is used as the liquid 50. For example, when the light source of the exposure light beam EL is the $F_2$ laser, the $F_2$ laser beam is not transmitted through water. Therefore, the exposure process can be performed by using the fluorine-based oil as the liquid 50 through which the $F_2$ laser beam is transmissive. As described above, it is possible to use, as the liquid 50, those other than water. Alternatively, for example, it is also possible to use, as the liquid 50, cedar oil which has the transmittance with respect to the exposure light beam EL, which has the refractive index as high as possible, and which is stable against the photoresist applied to the surface of the substrate P and the projection optical system PL. When the liquid other than water is used as the liquid 50, the liquid-removing process can be performed after performing the washing process for the substrate P with the washing unit 150. As described above, when the substrate P is washed, it is possible to wash out, for example, foreign matters adhered to the substrate P during the liquid immersion exposure or during the transport of the substrate P. The removal of the liquid is performed smoothly thereafter. It is possible to feed, from the exposure apparatus, the clean substrate P to which the liquid and the foreign matters are not adhered.

Any one of the liquid-removing units 100 provided for the exposure apparatuses according to the first to sixth embodiments may be used as the liquid-removing unit 100. The washing of the substrate P and the removal of the liquid adhered to the substrate P may be performed at an identical place. For example, the washing and the liquid removal may be performed in the chamber 25.

Ninth Embodiment

Next, an explanation will be made with reference to FIG. 14 about an exposure apparatus and a device-producing system according to a ninth embodiment of the present invention. This embodiment is characterized in that a liquid-processing mechanism 160, which processes the liquid fallen from the substrate P after the exposure, is provided under a transport passage of a transport system H for transporting the substrate P to the liquid-removing unit 100. In this embodiment, two substrate stages PST1, PST2 are provided, and the main body of the exposure apparatus is equivalent to that described in the first embodiment.

Figure 14:
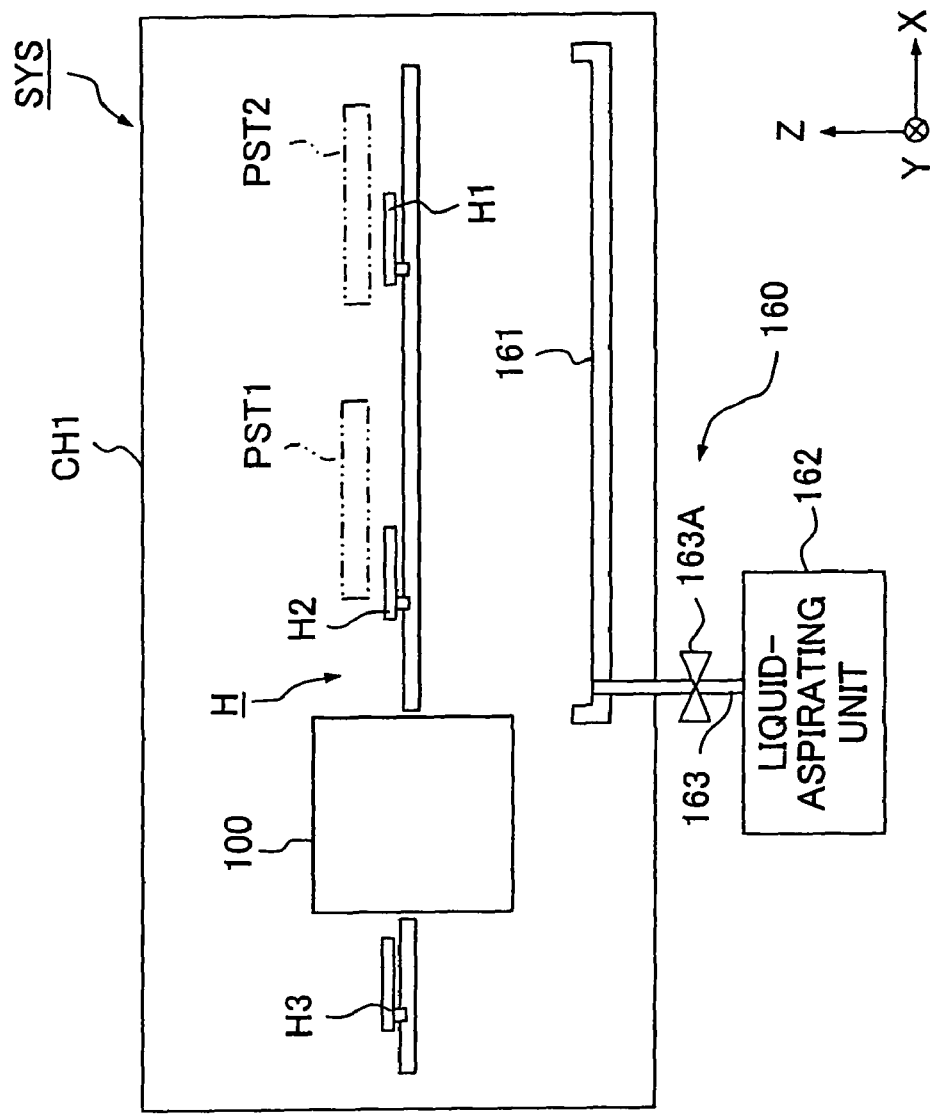
FIG. 14 shows still another embodiment of a device-producing system as an exposure apparatus of the present invention.

With reference to FIG. 14, the liquid-processing mechanism 160 includes a gutter member 161 which is arranged under the transport passage of the transport system H, and a liquid-sucking unit 162 which discharges, from the gutter member 161, the liquid 50 recovered by the gutter member 161. In this embodiment, the gutter member 161 is provided between the substrate stage PST (PST1, PST2) and the liquid-removing unit 100, i.e., under the transport passage of the second transport unit H2. The gutter member 161 is provided in a chamber unit CH1, and the liquid-sucking unit 162 is provided outside the chamber unit CH1. The gutter member 161 is connected to the liquid-sucking unit 162 via a tube passage 163. The tube passage 163 is provided with a valve 163A which opens/closes the flow passage of the tube passage 163.

There is such a possibility that the liquid 50 may fall from the substrate P during the transport of the substrate P to which the liquid 50 is adhered after the exposure by using the second transport unit H2. The fallen liquid 50 can be recovered with the gutter member 161. When the fallen liquid 50 is recovered with the gutter member 161, for example, it is possible to avoid such an inconvenience that the liquid 50 is scattered to the surroundings of the transport passage. The liquid-sucking unit 162 sucks the liquid 50 on the gutter member 161 provided in the chamber unit CH1, and thus the liquid 50 is discharged to the outside of the chamber unit CH1 and the liquid 50 cannot stay on the gutter member 161 in the chamber unit CH1. It is possible to avoid any inconvenience which would be otherwise caused such that the humidity change (environmental change) occurs in the chamber unit CH1. The liquid-sucking unit 162 can continuously perform the operation for sucking the liquid 50 recovered by the gutter member 161. Alternatively, the liquid-sucking unit 162 can intermittently perform the sucking operation in only a preset predetermined period. When the sucking operation is continuously performed, the liquid 50 does not stay on the gutter member 161. Therefore, it is possible to more reliably avoid the humidity change in the chamber unit CH1. On the other hand, when the sucking operation (discharge operation) by the liquid-sucking unit 162 is not performed, for example, during the exposure for the substrate P by the main body of exposure apparatus EX, and the sucking operation is performed in only the period other than the exposure, then it is possible to avoid any inconvenience which would be otherwise caused such that the vibration, which is generated by the sucking operation, affects the exposure accuracy.

It is desirable that the gutter member 161 is provided over an entire area under the transport passage for transporting the substrate P which has a possibility of adhesion of the liquid. However, the gutter member 161 may be provided partially and/or separately at any place which tends to be affected by the liquid fallen from the substrate P. The liquid-processing mechanism 160, which is disposed under the transport passage, is not limited to the gutter member 161 and the liquid-sucking unit 162. It is also allowable to adopt any system capable of recovering the liquid fallen from the substrate P or the like.

Any liquid-removing unit 100, which is provided for any one of the exposure apparatuses according to the first to sixth embodiments, may be employed as the liquid-removing unit 100. It is also possible to provide, in the transport passage, the washing unit as used in the first to sixth embodiments.

In the embodiment described above, the liquid-removing unit 100 is provided in order to remove the liquid which cannot be completely recovered by the liquid recovery unit 2 and which adheres to (remains on) the substrate P. However, it is not necessarily indispensable to provide the liquid recovery unit 2.

The substrate P, which is usable in the respective embodiments described above, is not limited to the semiconductor wafer for producing the semiconductor device. Those applicable include, for example, the glass substrate for the display device, the ceramic wafer for the thin film magnetic head, and the master plate (synthetic quartz, silicon wafer) for the mask or the reticle to be used for the exposure apparatus.

The embodiment described above adopts the exposure apparatus in which the space between the projection optical system PL and the substrate P is locally filled with the liquid. However, the present invention is also applicable to the liquid immersion exposure apparatus in which the stage for retaining the exposure objective substrate is moved in the liquid bath and the liquid immersion exposure apparatus in which the liquid pool having the predetermined depth is formed on the stage and the substrate is retained therein. The liquid immersion exposure apparatus in which the stage for retaining the exposure objective substrate is moved in the liquid bath is disclosed in detail, for example, in Japanese Patent Application Laid-open No. 6-124873, and the liquid immersion exposure apparatus in which the liquid pool having the predetermined depth is formed on the stage and the substrate is retained therein are disclosed in detail, for example, in Japanese Patent Application Laid-open No. 10-303114 and U.S. Pat. No. 5,825,043. These patent documents are incorporated herein by reference within a range of permission of the domestic laws and ordinances of the state designated or selected in this international application.

As for the exposure apparatus (main body of the exposure apparatus) EX, the present invention is applicable to the scanning type exposure apparatus (scanning stepper) based on the step-and-scan system for performing the scanning exposure for the pattern of the mask M by synchronously moving the mask M and the substrate P as well as the projection exposure apparatus (stepper) based on the step-and-repeat system for performing the full field exposure for the pattern of the mask M in a state in which the mask M and the substrate P are allowed to stand still, while successively step-moving the substrate P. The present invention is also applicable to the exposure apparatus based on the step-and-stitch system in which at least two patterns are partially overlaid and transferred on the substrate P.

As for the type of the exposure apparatus EX, the present invention is not limited to the exposure apparatus for the semiconductor production apparatus for exposing the substrate P with the semiconductor device pattern. The present invention is also widely applicable, for example, to the exposure apparatus for producing the liquid crystal display device or for producing the display as well as the exposure apparatus for producing, for example, the thin film magnetic head, the image pickup device (CCD), the reticle, or the mask.

When the linear motor is used for the substrate stage PST and/or the mask stage MST, it is allowable to use any one of those of the air floating type based on the use of the air bearing and those of the magnetic floating type based on the use of the Lorentz's force or the reactance force. Each of the stages PST, MST may be either of the type in which the movement is effected along the guide or of the guideless type in which no guide is provided. An example of the use of the linear motor is disclosed in U.S. Pat. Nos. 5,623,853 and 5,528,118, contents of which are incorporated herein by reference within a range of permission of the domestic laws and ordinances of the state designated or selected in this international application.

As for the driving mechanism for each of the stages PST, MST, it is also allowable to use a plane motor in which a magnet unit provided with two-dimensionally arranged magnets and an armature unit provided with two-dimensionally arranged coils are opposed to one another, and each of the stages PST, MST is driven by the electromagnetic force. In this arrangement, any one of the magnet unit and the armature unit may be connected to the stage PST, MST, and the other of the magnet unit and the armature unit may be provided on the side of the movable surface of the stage PST, MST.

The reaction force, which is generated in accordance with the movement of the substrate stage PST, may be mechanically released to the floor (ground) by using a frame member so that the reaction force is not transmitted to the projection optical system PL. The method for handling the reaction force is disclosed in detail, for example, in U.S. Pat. No. 5,528,118 (Japanese Patent Application Laid-open No. 8-166475), a content of which is incorporated herein by reference within a range of permission of the domestic laws and ordinances of the state designated or selected in this international application. The reaction force, which is generated in accordance with the movement of the mask stage MST, may be mechanically released to the floor (ground) by using a frame member so that the reaction force is not transmitted to the projection optical system PL. The method for handling the reaction force is disclosed in detail, for example, in U.S. Pat. No. 5,874,820 (Japanese Patent Application Laid-open No. 8-330224), a content of which is incorporated herein by reference within a range of permission of the domestic laws and ordinances of the state designated or selected in this international application.

As described above, the exposure apparatus EX according to the embodiment of the present invention is produced by assembling the various subsystems including the respective constitutive elements as defined in claims so that the predetermined mechanical accuracy, the electric accuracy, and the optical accuracy are maintained. In order to secure the various accuracies, those performed before and after the assembling include the adjustment for achieving the optical accuracy for the various optical systems, the adjustment for achieving the mechanical accuracy for the various mechanical systems, and the adjustment for achieving the electric accuracy for the various electric systems. The steps of assembling the various subsystems into the exposure apparatus include, for example, the mechanical connection, the wiring connection of the electric circuits, and the piping connection of the air pressure circuits in correlation with the various subsystems. It goes without saying that the steps of assembling the respective individual subsystems are performed before performing the steps of assembling the various subsystems into the exposure apparatus. When the steps of assembling the various subsystems into the exposure apparatus are completed, the overall adjustment is performed to secure the various accuracies as the entire exposure apparatus. It is desirable that the exposure apparatus is produced in a clean room in which, for example, the temperature and the cleanness are managed.

Figure 15:
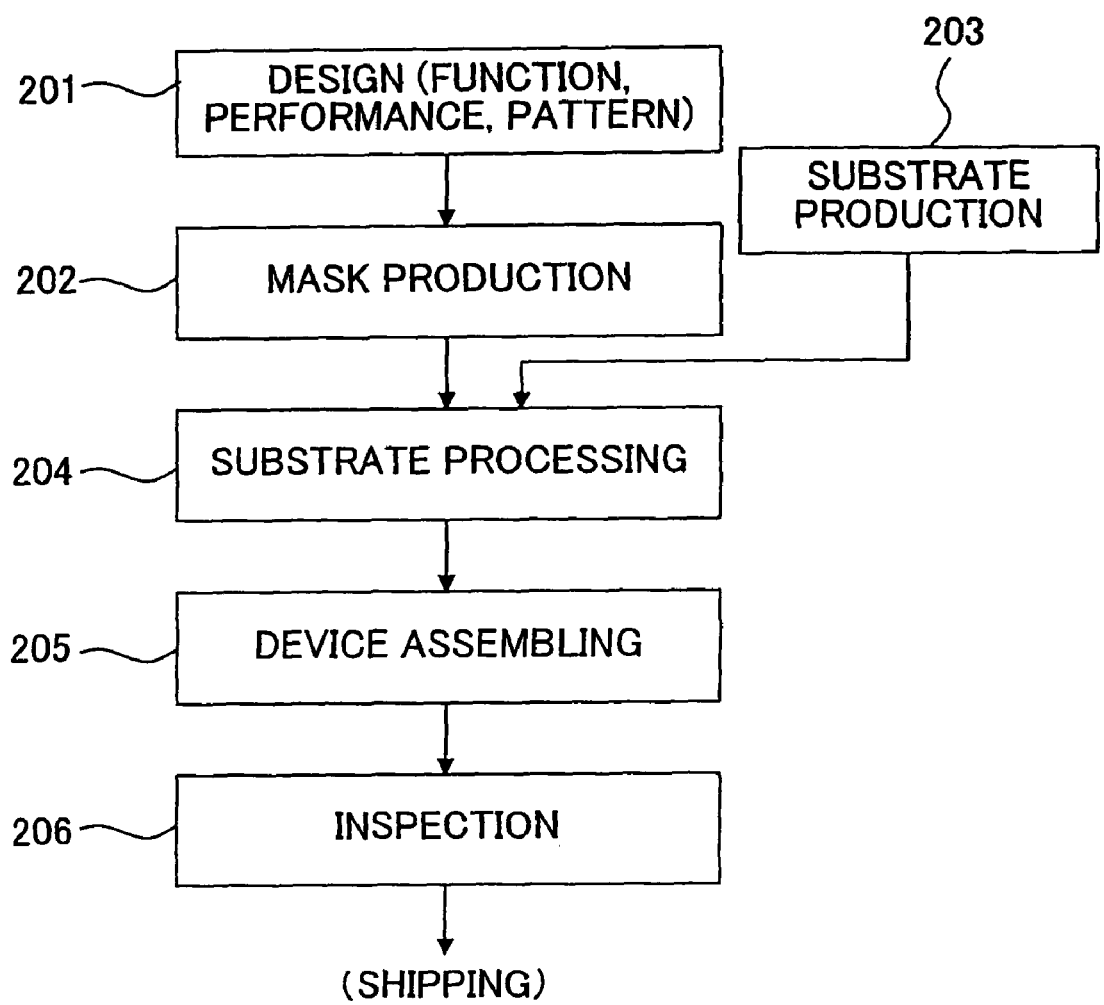
FIG. 15 shows a flow chart illustrating exemplary steps of producing a semiconductor device.

As shown in FIG. 15, the microdevice such as the semiconductor device is produced by performing, for example, a step 201 of designing the function and the performance of the microdevice, a step 202 of manufacturing a mask (reticle) based on the designing step, a step 203 of producing a substrate as a base material for the device, an exposure process step 204 of exposing the substrate with a pattern of the mask by using the exposure apparatus EX of the embodiment described above, a step of assembling the device (including a dicing step, a bonding step, and a packaging step) 205, and an inspection step 206.

According to the present invention, it is possible to avoid the change of the environment for the exposure process and the scattering of the liquid to the surroundings. Therefore, it is possible to avoid the decrease in the exposure process accuracy which would be otherwise caused by the environmental change and the liquid scattering, and it is possible to produce the device having desired performance. The substrate, to which the liquid and the foreign matters are not adhered, can be fed from the exposure apparatus. Therefore, it is possible to produce the device having desired performance.

What is claimed is:

1. A pattern formation method comprising the steps of:
    forming a resist film on a substrate;
    performing pattern exposure by selectively irradiating the resist film with exposing light via a projection optical system and an immersion liquid in a first chamber, a space between the projection optical system and the resist film is locally filled with the immersion liquid;
    transferring the substrate into a second chamber which has a cover member, the substrate being surrounded by the cover member;
    removing the immersion liquid remaining on a surface of the resist film in the second chamber after the pattern exposure; and
    forming a resist pattern by developing the resist film after removing the immersion liquid.

2. The pattern formation method of claim 1, wherein the step of removing the immersion liquid is a step of blowing air against the resist film after the pattern exposure, a step of dehumidifying an atmosphere around the resist film after the pattern exposure, or a step of warming the resist film after the pattern exposure.

3. The pattern formation method of claim 1, wherein the immersion liquid is water, cedar oil or a fluorine-based oil.

4. The pattern formation method of claim , wherein the exposing light is KrF excimer laser, ArF excimer laser or $F_2$ laser.

5. A pattern formation method comprising the steps of:
    forming a resist film on a substrate;
    performing pattern exposure by selectively irradiating the resist film with exposing light via a projection optical system and an immersion liquid in a first chamber, a space between the projection optical system and the resist film is locally filled with the immersion liquid;
    transferring the substrate into a second chamber which has a cover member, the substrate being surrounded by the cover member;
    blowing air against the resist film in the second chamber after the pattern exposure; and
    forming a resist pattern by developing the resist film after blowing the air against the resist film.

6. The pattern formation method of claim 5, wherein the air is warm air.

7. The pattern formation method of claim 5, wherein the immersion liquid is water, cedar oil or a fluorine-based oil.

8. The pattern formation method of claim 5, wherein the exposing light is KrF excimer laser, ArF excimer laser or $F_2$ laser.

* * * * *